United States Patent [19]

O'Brien et al.

[11] Patent Number: 5,793,521

[45] Date of Patent: *Aug. 11, 1998

[54] DIFFERENTIALLY PATTERNED PUMPED OPTICAL SEMICONDUCTOR GAIN MEDIA

[75] Inventors: Stephen O'Brien, Sunnyvale; Alexander Schoenfelder, Cupertino; Robert J. Lang, Pleasanton, all of Calif.; Amos A. Hardy, Tel Aviv, Israel; Ross A. Parke, Fremont; David F. Welch, Menlo Park, both of Calif.

[73] Assignee: SDL Inc., San Jose, Calif.

[*] Notice: The term of this patent shall not extend beyond the expiration date of Pat. No. 5,539,571.

[21] Appl. No.: 684,786

[22] Filed: Jul. 22, 1996

Related U.S. Application Data

[63] Continuation-in-part of Ser. No. 202,359, Feb. 28, 1994, Pat. No. 5,539,571, which is a continuation-in-part of Ser. No. 948,673, Sep. 21, 1992, abandoned.

[51] Int. Cl.$^6$ ........................................ H01S 3/00
[52] U.S. Cl. .................................................. 359/344
[58] Field of Search ............................... 359/333, 344; 372/43, 50

[56] References Cited

U.S. PATENT DOCUMENTS

| | | | |
|---|---|---|---|
| 4,558,449 | 12/1985 | Gordon | 372/44 |
| 4,713,821 | 12/1987 | Bradford et al. | 372/44 |
| 4,744,089 | 5/1988 | Montroll et al. | 372/96 |
| 4,751,719 | 6/1988 | Mito et al. | 372/96 |
| 4,856,017 | 8/1989 | Ungar | 372/96 |
| 4,932,034 | 6/1990 | Usami et al. | 372/96 |
| 4,942,585 | 7/1990 | Ungar | 372/44 |
| 4,965,525 | 10/1990 | Zah | 330/4.3 |
| 4,977,567 | 12/1990 | Hanke | 372/45 |
| 5,003,550 | 3/1991 | Welch et al. | 372/50 |
| 5,012,484 | 4/1991 | Flynn et al. | 372/96 |
| 5,021,742 | 6/1991 | Jacob | 330/4.3 |
| 5,029,297 | 7/1991 | Halemane et al. | 330/4.3 |
| 5,050,175 | 9/1991 | Ayral et al. | 372/21 |
| 5,103,456 | 4/1992 | Scifres et al. | 372/50 |
| 5,111,475 | 5/1992 | Ackerman et al. | 372/96 |
| 5,175,643 | 12/1992 | Andrews | 359/339 |
| 5,181,213 | 1/1993 | Shinokura et al. | 372/30 |
| 5,220,572 | 6/1993 | Kawaguchi | 372/30 |
| 5,400,353 | 3/1995 | Walpole et al. | 372/46 |
| 5,499,261 | 3/1996 | Welch et al. | 372/50 |
| 5,513,196 | 4/1996 | Bischel et al. | 372/22 |
| 5,539,571 | 7/1996 | Welch et al. | 359/344 |

OTHER PUBLICATIONS

Bendelli, et al. entitled "A new Structure for High Power TW-SLA", IEEE Photonics Technology Letter vol. 3, No. 1, Jan. 1991.

*Primary Examiner*—Mark Hellner
*Attorney, Agent, or Firm*—W. Douglas Carothers, Jr.

[57] ABSTRACT

An optical gain medium comprising, for example, an optical semiconductor device which is differentially pumped and a master oscillator power amplifier (MOPA) device employing such an amplifier. The gain medium may have a linear stripe region or a diverging stripe region that allows the light propagating therein to diverge along at least part of its length, such as a flared or tapered amplifier having a gain region that increases in width toward its output at a rate that equals or exceeds the divergence of the light. The amplifier is pumped with a current density at its input end which is smaller than the current density used to pump the output end for maintaining coherence of the beam to high power levels employing differential pumping. Differential pumping may be both longitudinal and lateral within the amplifier and may be patterned to reduce the peak modal gain observed longitudinally along and/or laterally across the pumped stripe region of the gain medium so that he experienced modal gain of the propagating light is more balanced along the length of the stripe region, i.e., rendered significantly more uniform in distribution, providing for higher diffraction limited performance without optical filamentation formation.

55 Claims, 19 Drawing Sheets

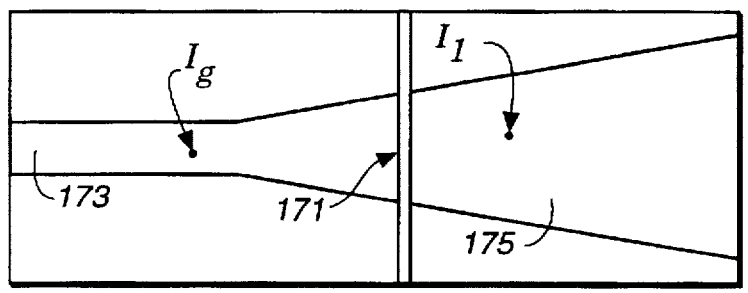
FIG._34
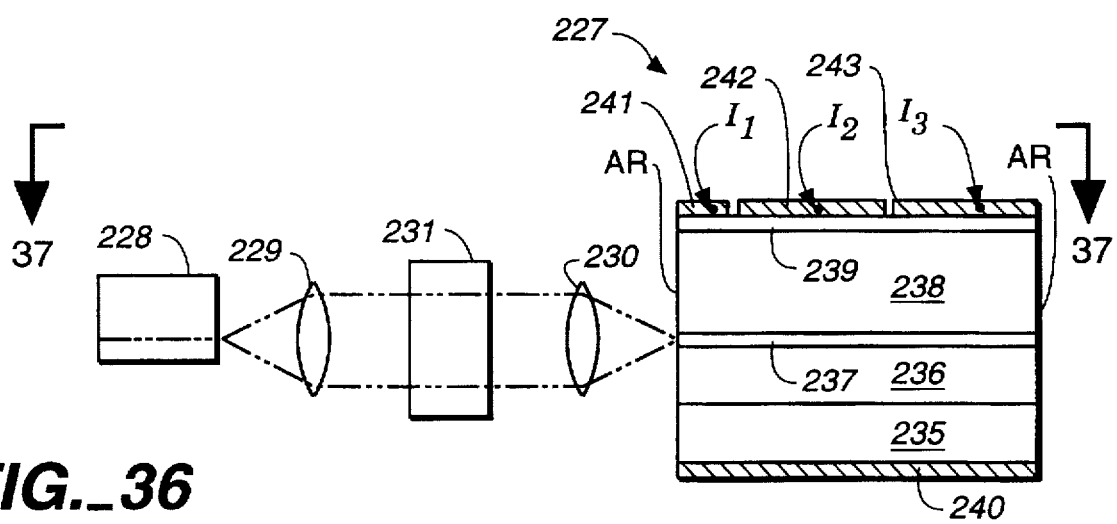
FIG._36
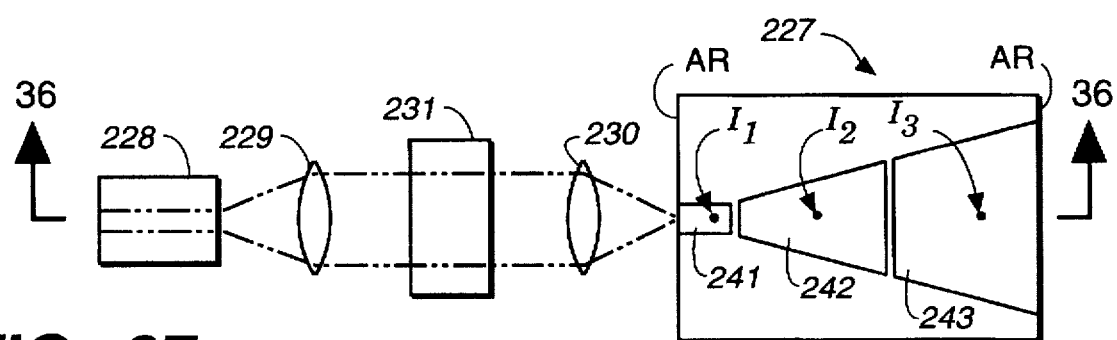
FIG._37

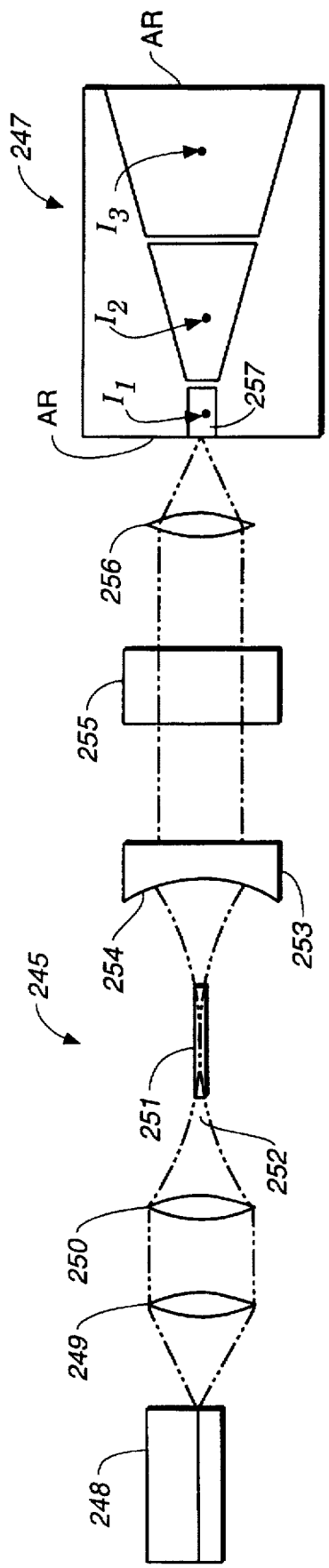
FIG._38

DIFFERENTIALLY PATTERNED PUMPED OPTICAL SEMICONDUCTOR GAIN MEDIA

CROSS-REFERENCE TO RELATED APPLICATIONS

This a continuation-in-part of Ser. No. 08/202,359, filed Feb. 28, 1994, now U.S. Pat. No. 5,539,571, issued Jul. 23, 1996, which is a continuation-in-part of Ser. No. 07/948,673, filed Sep. 21, 1992, abandoned.

FIELD OF THE INVENTION

The present invention relates generally to differential pumping of linear or diverging gain media and more particularly to patterning pumping of such gain media toward achieving modal gain balancing along the longitudinal length and/or lateral extent of the propagating light in such media.

BACKGROUND OF THE INVENTION

Attempts as to configuration of the distribution in gain media, such as diode lasers and optical semiconductor amplifiers, are known in the art. One such example is in U.S. Pat. No. 4,751,719 to Mito et al. wherein the distribution of the current to be injected into the active region of the laser device is controlled through series connected resistors applied to a plurality of electrically isolated electrodes formed on the top of the device. The optical field intensity profile is shown to substantially conform with the current density profile along the direction of light propagation but this is not always correct. U.S. Pat. No. 5,111,475 to Ackerman et al. deals with attempts to control the of the photon distribution in DFB laser diodes by repositioning the peak of photon distribution in the back portion of the device. The photon distribution may or may not be affected by the current density. However, in order to effectively enhance the performance of these devices, for example, the attributes of the linewidth enhancement factor must be appreciated and its relationship with the modal gain profile in relation to the current density must be fully appreciated and understood. These factors are not considered and utilized in a manner to control the modal gain profile to achieve enhanced diffraction limited performance and beam quality at the output of these devices, which is the subject of this invention.

An object of the invention is to provide an optical gain medium with efficient, high power, coherence-maintaining amplifier operation.

Another object of this invention is an optical gain medium that provides for improved modal gain balancing along the light propagating length of the device.

Another object of the invention is an optical amplifier that provides for reduced filamentation and/or maximum gain within at least a portion of the device.

SUMMARY OF THE INVENTION

The above objects have been met with an optical gain medium which is differentially pumped. Instead of being pumped with a uniform current density over its entire length, the gain medium is pumped with different current densities in different regions of the gain medium, such as a semiconductor optical amplifier. For example, a reduced current density is provided at the input end of the amplifier compared to its output end. This variation along the direction of light propagation in the amplifier of the current injection into the amplifier improves the high power coherent operation of the amplifier. Though the optical amplifier is capable, in principle, of supporting the propagation of multiple spatial modes in its wide portions, only the single spatial mode of the light received at its input actually propagates and the amplifier maintains this mode as the light is amplified to high power levels. The amplifier may have a wide linear gain region or have a diverging gain region to allow the light to diverge as it propagates in the amplifier. By having a low current density at the input end, the injected light beam is first allowed to diverge in the amplifier before receiving strong amplification in the more heavily pumped output region of the amplifier. Hot spots or other processes that cause filamentation particularly near the input end, which would otherwise distort the beam and lead to optical filamentation and a spatially incoherent multimode output, are, thus, avoided by providing a lower level of pumping near the input end. To reduce the tendency toward filamentation, this low level pumping of the first amplifier section should extend for at least several Rayleigh ranges of the injected beam. Also, by only allowing strong amplification at the output end of the amplifier, spatial hole burning in the input region is avoided.

Different current densities are provided in the form of a plurality of pumping stripes that provide a monotonic increase in the averaged current density, linearly or exponential-like, along the gain stripe region in the direction of light propagation in the gain medium toward its output end. The monotonical alteration of the current density can be not only longitudinal of the direction of light propagation but also lateral of the direction of light propagation. Among the preferred embodiments is the monotonical increase of the current density in an exponential-like manner to achieve more evenly distributed gain along the gain stripe region reducing the spatial local modal gain maxima across the modal gain profile, reducing the effective linewidth enhancement factor, $\alpha_{lw}$, reducing or otherwise eliminating filamentation growth along the length of the gain medium and improving diffraction limited performance of the device. As a result, higher diffraction limited performance is achieved with a smoother, more Gaussian-like near field profile. Moreover, mechanisms are disclosed for interacting with the propagating light along the edge regions of the gain stripe of the gain medium improving the scattering of higher order modes, decreasing lateral divergence of the beam in the case of high brightness applications with the near field will assuming a smoother, more Gaussian-like profile, and reducing the tendency for optical filamentation.

Other objects and attainments together with a fuller understanding of the invention will become apparent and appreciated by referring to the following description and claims taken in conjunction with the accompanying drawings.

BRIEF DESCRIPTION OF THE DRAWINGS

FIGS. 4–15 and 18–34 are top plan views of additional MOPA embodiments in accord with the present invention.

FIGS. 36 and 37 are respective sectional and top plan views of an optical amplifier of the present invention coupled to an external laser diode. The sectional view in FIG. 36 is taken along the line 36—36 in FIG. 37.

FIG. 38 is a top plan view of an optical amplifier of the present invention coupled to a laser-diode-pumped solid-state laser.

DETAILED DESCRIPTION OF THE PREFERRED EMBODIMENTS OF THE INVENTION

As used herein, "gain medium" means any device having an active region that provides a gain enhancement to propagating radiation, which may be a laser, optical amplifier, and an optical filter, modulator or absorber. Also, there are references in this description to "diverging gain medium" which means a gain medium of non-constant width along its longitudinal length, some of which are also referred to as a flared or tapered amplifier, a master oscillator power amplifier (MOPA), or an amplifier capable of supporting light propagation of a diverging phase front. Examples of different types of gain media are discussed in the following embodiments.

Figure 1:
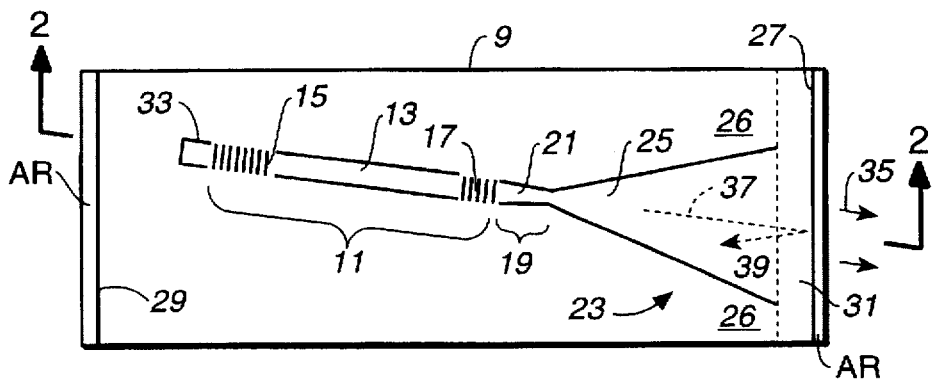
FIG. 1 is a top plan view of a MOPA device of the present invention.
Figure 2:
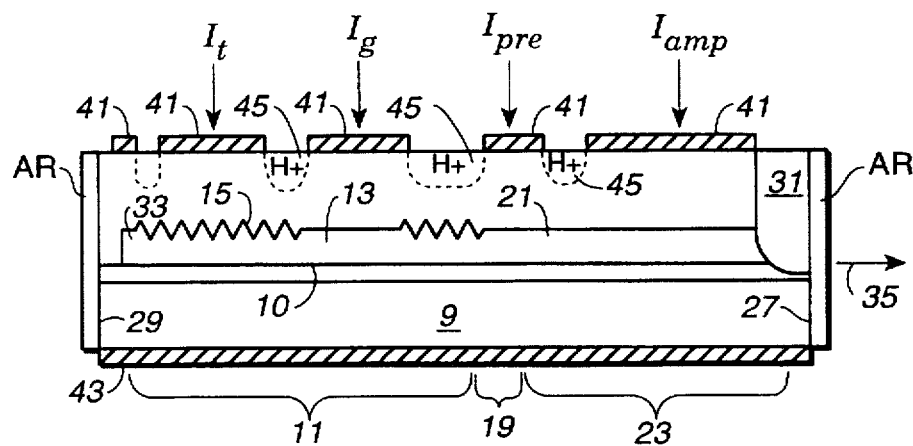
FIG. 2 is a side sectional view taken along the line 2—2 in FIG. 1.

With reference to FIGS. 1 and 2, a monolithically integrated, flared amplifier type, master oscillator power amplifier (MOPA) device of the present invention comprises a single mode diode laser oscillator 11, an optical preamplifier 19 and a flared optical power amplifier 23, all formed on a common substrate 9. The MOPA device is formed as a semiconductor material body with a plurality of contiguous semiconductor layers disposed on the substrate 9 and with electrodes 41 and 43 provided on top and bottom surfaces of the body. Typically, the material composition is some combination of group III–V compound semiconductors, such as GaAs/AlGaAs, InGaAs/AlGaAs or InP/InGaAsP. However, other direct bandgap semiconductor materials may also be used. The semiconductor material body can be formed with a homostructure, single heterostructure or, preferably, a double heterostructure or multiheterostructure. All such structures include an active light emitting region 10 near a pn junction in the body. This active region 10 may be a single active layer, a single quantum well structure or a multiple quantum well (MQW) structure. Strained layer superlattice structures may be used. The electrodes 41 and 43 provide a forward electrical bias across the pn junction and inject electrical current $I_r$, $I_g$, $I_{pre}$ and $I_{amp}$ through the active region 10 in the various areas of the MOPA device. Thus, a pump current $I_g$ greater than a lasing threshold current density is injected through the active region 10 in a gain section 13 of the laser oscillator 11 causing lightwaves to be generated in the gain section 13 and to propagate under lasing conditions. The function of the other current injections will be described later. The active region 10 and the adjacent layers above and below it form a transverse waveguide for light propagation. The term "transverse" is used here to refer to the direction perpendicular to the plane of the active region 10. Lateral waveguiding is also provided in portions of the MOPA device which are specified below. The term "lateral" refers to the direction in the plane of the active region transverse to the direction of propagation. The direction of laser light propagation itself is referred to as the "longitudinal" direction.

The diode laser oscillator 11 is preferably a distributed Bragg reflector (DBR) laser defined by first or second order DBR gratings 15 and 17 bounding a single mode gain section 13. Preferably, lateral real refractive index waveguiding is used to define the single mode gain section 13. The gratings 15 and 17 may be formed between two adjacent semiconductor layers with different refractive indices or at an air-semiconductor interface on a surface of the semiconductor material body. Such gratings should be sufficiently close to the active light emitting region 10 to interact with lightwaves propagating in the active region 10 and neighboring layers. The degree of optical lightwave overlap or modal gain, $\Gamma_g$, with the gratings 15 and 17 partially determines the effective reflectivity of these gratings. Deeper grating teeth generally have higher reflectivity. Gratings with a greater number of teeth, such as rear DBR grating 15, also tend to have greater reflectivity than gratings with fewer teeth. Grating reflectivity further depends on the relation between the tooth spacing or grating pitch and the wavelength of the incident lightwaves. Periodic gratings have a reflection response that peaks at the wavelength that satisfies the Bragg condition $\Lambda = m\lambda_0/2\, n_{\mathit{eff}}$, where m is an integer representing the diffraction order, $\lambda_0$ is the free space wavelength of the lightwaves and $n_{\mathit{eff}}$ is the effective refractive index in the grating region. Whenever they can be fabricated, first order gratings (m=1) are preferable, because they generally have a higher reflectivity than second order gratings. Second order gratings (m=2), on the other hand, because of their larger pitch $\Lambda$, are easier to fabricate than first order gratings.

The use of a DBR laser 11 in the MOPA device of the present invention minimizes multiple residual reflections into the power amplifier 23 and enables higher operating powers for the MOPA device. (If cleaved coupled cavities were to be used instead, the residual reflections to the amplifier that would occur in the cleaved region between the master oscillator and the power amplifier would limit operation of the MOPA to low or moderate power.) The DBR laser oscillator 11 also enables the alignment of the length of the MOPA at a nonperpendicular angle to the cleaved output facet 27, as indicated by the longitudinal axis 37 of the MOPA. Such an alignment reduces reflective feedback into the master oscillator 11 and also eliminates filamentation in the power amplifier 23. Any light traveling along the longitudinal axis 37, or along a parallel path, that happens to be reflected by the antireflection (AR) coated emitting facet 27 will be directed along a new path in a different direction that is not parallel to the axis 37, as indicated by dashed line 39 in FIG. 1. Typically, an alignment in which the longitudinal axis 37 is at least 6° away from the perpendicular to the facet 27 is sufficient to minimize feedback.

In order to reduce residual reflections off of the rear facet 29 and to prevent such light from coupling back through the rear DBR grating 15 into the laser oscillator 11, the grating 15 should be made highly reflective, such as by giving it a large number of teeth, and the facet 29 antireflection (AR) coated to give it very low reflectivity. A detector 33 for power monitoring may be provided at the rear of the laser. A separate conductive surface contact and lead will provide the detector 33.

Minimal absorption in the grating regions 15 and 17 can be achieved by a change of composition of the semiconductor material, by means of impurity induced disordering (IID), etch-and-regrowth or other methods of composition change, in order to raise the effective bandgap in those regions. Alternatively, one or both of the gratings 15 and 17 can be pumped with electrical current to minimize the absorption. Such pumping also has the effect of making the grating region frequency tunable. For example, in the embodiment shown in FIGS. 1 and 2, the high reflectivity, rear DBR grating 15 of the laser oscillator 11 is electrically pumped with a tuning current $I_t$. The injection of current $I_t$ into the grating region 15 changes the effective index of refraction $n_{\mathit{eff}}$ in the grating region 15, and therefore, changes the wavelength of peak reflectivity of the grating 15. This changes the emission wavelength of the laser oscillator 11, allowing the laser to be frequency tunable. Typically, the laser oscillator is tunable over a wavelength range of at least 5 nm. The conductive surface contacts 41 for injecting the tuning current $I_t$, pump current $I_g$ and others may be electrically isolated from one another by isolation regions 45 formed in the surface of the semiconductor body by proton implantation or by other known means.

The output of the master oscillator 11 is coupled to a preamplifier 19 prior to being injected into the flared amplifier 23. The preamplifier 19 has a single mode waveguide 21. Alternatively, the preamplifier 19 need not be a single mode preamplifier over its entire length. The active region 10 in the waveguide 21 is electrically pumped with a current $I_{pre}$ injected through conductive contacts 41 and 43. The contact 41 for the preamplifier 19 may be electrically isolated from adjacent contacts for the laser oscillator's gain region 13 and for the flared amplifier 23 by means of proton surface implants 45 or by another known isolation structure. The single mode waveguide 21 of the preamplifier 19 can have a constant mode width, typically about 1 µm to 5 µm. Alternatively, the preamplifier waveguide 21 can be tapered or flared slightly to a smaller or larger width in order to increase or decrease the divergence of the beam in the flared amplifier section 23. The smaller the output of the preamplifier 19 is, the larger the divergence of the beam in the amplifier 23 will be, and the faster the flare of the amplifier 23 will need to be in order to match this increased divergence. The higher divergence beam that results from such a tapered preamplifier waveguide 21 will generally result in a higher output power over a shorter amplifier length.

The optical signal power received by the preamplifier 19 from the laser oscillator 11 is amplified (or absorbed) by the preamplifier 19 to a signal level which is optimized so as not to produce spatial hole burning in the flared amplifier. Thus, the current density in the preamplifier 19 may require separate adjustment from that of the flared amplifier 23.

Figure 5:
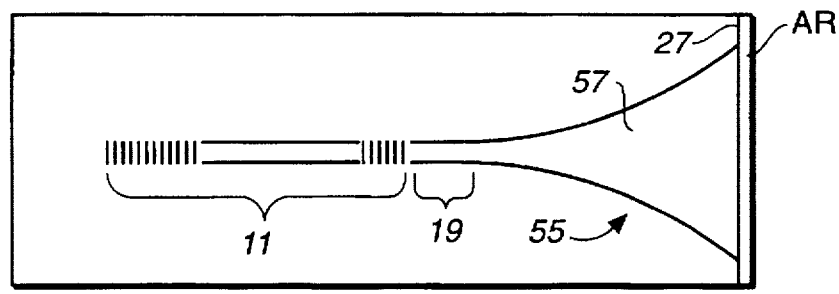
Figure 18:
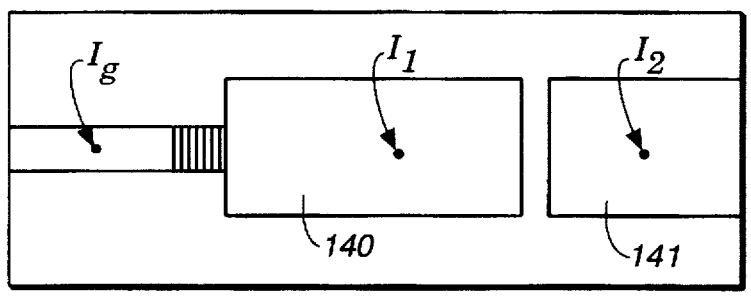
Figure 19:
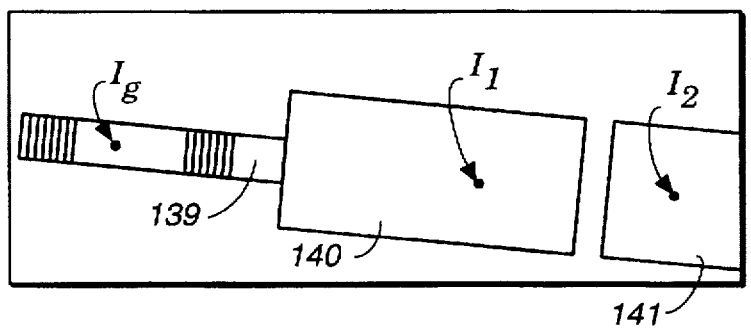

A flared power amplifier 23 is coupled to the preamplifier 19. The amplifier 23 has a transverse waveguiding region 25 with an active light emitting gain region 10 sandwiched between adjacent, higher bandgap, lower refractive index layers above and below the active region 10. The transverse waveguiding region 25 of the amplifier 23 could also be designed, by tailoring the composition and thickness of one or more of the semiconductor material layers that form the waveguide 25, to minimize the optical overlap of the propagating mode with the active region 10 in order to avoid saturation and to maximize the gain and output power, while minimizing the effects of charge and intensity dependent lensing. Such an optimization could involve making waveguide above, below, or both above and below the active region 10 to be asymmetric, thereby causing the peak intensity of the light means to not reside in the active region 10. The amplifier 23 is electrically pumped with an amplification current $I_{amp}$ through conductive contacts 41 and 43. The width of the top conductive contact 41 above the amplifier 23, and consequently the width of the gain region, is flared such that it has a first width at the input end of the amplifier 23 that substantially matches the width of the output of the preamplifier waveguide 21 and a second width at the output end of the amplifier 23 that is significantly wider than the first width. Typically, the amount of flare or increase in width in the amplifier's pumped gain region defined by the contact 41 or other lateral waveguiding means matches or is only slightly larger than the divergence of the light beam received from the preamplifier 19. The flare of the pumped gain region 25 of the amplifier 23 is typically linear, as shown in FIG. 1, but could also be parabolic, as seen in FIG. 5, or some other shape, such as the rectangular amplifier sections 139–141 seen in FIGS. 18 and 19, selected to maximize the diffraction limited output power.

The areas 26 outside of the pumped gain region 25 of the flared waveguide 23 can be made to have higher loss, such as by compositional change to remove the transverse waveguiding properties of one or both of the layers sandwiching the active region layer(s) 10 or by another known means of increasing absorption or loss, in order to reduce distortions associated with edge effects of the amplifier 25. The amplifier 23 can be uniformly pumped with the amplification current $I_{amp}$ by means of a contact 41 that extends over the entire flared region 25. Alternatively, the pump pattern of the flared amplifier 23 can be tailored, as shown for example in FIG. 7, to match the intensity profile of the propagating beam, thereby reducing the intensity dependent lensing effects in the flared amplifier region 25.

Figure 8A:
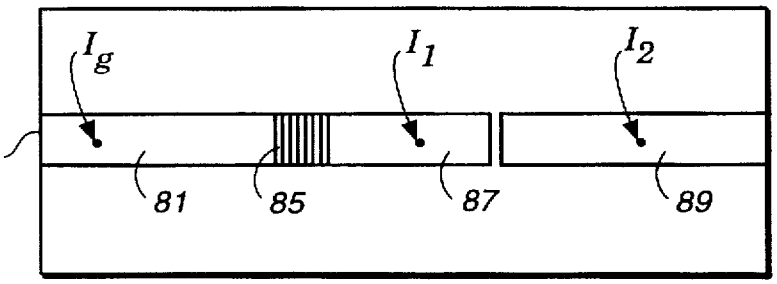
Figure 8B:
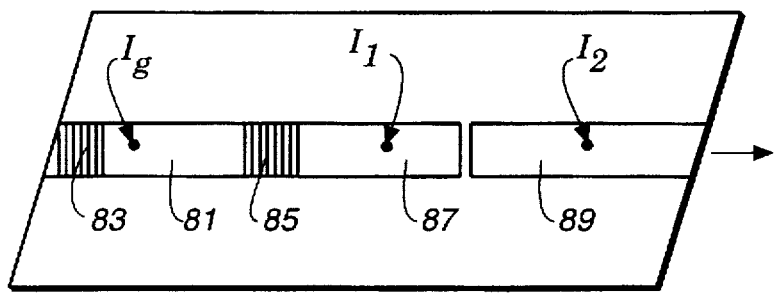

Differential pumping along the length of the amplifier can allow higher power, more efficient, more coherent operation. In the case of single mode amplifiers (which do not contain a flare or broad area amplifier), such as those seen in FIGS. 8a, 8b and 9, pumping a lower current $I_1$ on the input end 87 versus the current $I_2$ on the output end 89 has at least two advantages.

First, if the amplifier 87 and 89 can be differentially pumped, then the amplifier output can be modulated by pumping a much smaller section 87 of the amplifier, preferably near the amplifier input end. This allows high speed modulation since (a) the modulated segment 87 of the amplifier can be quite short allowing a low total modulation current $I_1$ to be used and (b) modulation of the input 87 to the amplifier rather than the laser 81 itself eliminates chirping (wavelength modulation) which occurs when the laser pump current $I_g$ is modulated. Note that the amplifier is modulated by turning on and off the forward bias current $I_1$. Alternatively, a reverse biased modulator section 87 outside the laser 81, followed by another amplifier section 89 is also possible since the reverse biased modulator section 87 could be made shorter in order to achieve the same on/off extinction ratio if a lower input power were injected into the modulator 87 (that is, the following amplifier section 89 allows the input to the modulator section 87 to be of lower intensity, thereby allowing the modulator 87 to be shorter and therefore of higher speed).

Figure 9:
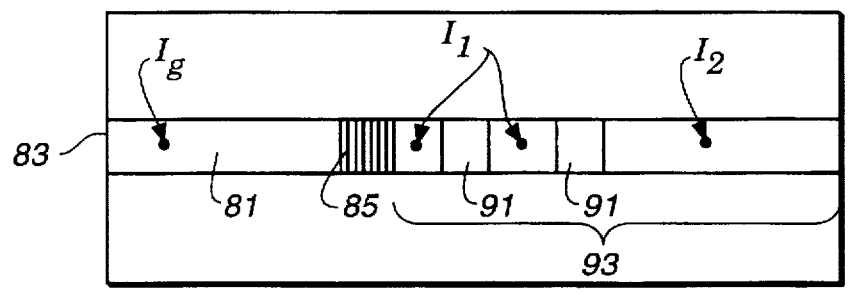

Second, if the amplifier 87 or 89 (or any amplifier) is differentially pumped wherein a lower current $I_1$ is applied near the input end 87 of the amplifier versus the output end 89, then the noise caused by spontaneous emission which could be fed back into the laser source should be reduced. This can be understood by considering a noise photon that is generated either near the input end or output end of the amplifier. If a noise photon happens to be generated near the output end 89, and if the input end 87 has high gain, this photon will be highly amplified as it travels toward the laser 81. However, if the input end 87 has low gain, a lower noise amount will be injected into the laser 81. The differential pumping could be produced with electrically isolated contacts over the different sections 87 and 89, as in FIGS. 8a and 8b, or could be produced using resistive segments 91, as seen in FIG. 9. The resistive segments 91 may be insulative material or implanted material in the amplifier region 93, providing higher resistance to the flow of current $I_1$. The segments would have variable lengths or spacings so that the effective current density seen at the active gain region of the amplifier section 93 varies along its length. This technique allows contacts connected to the same potential to be used on all of the sections.

Figure 17A:
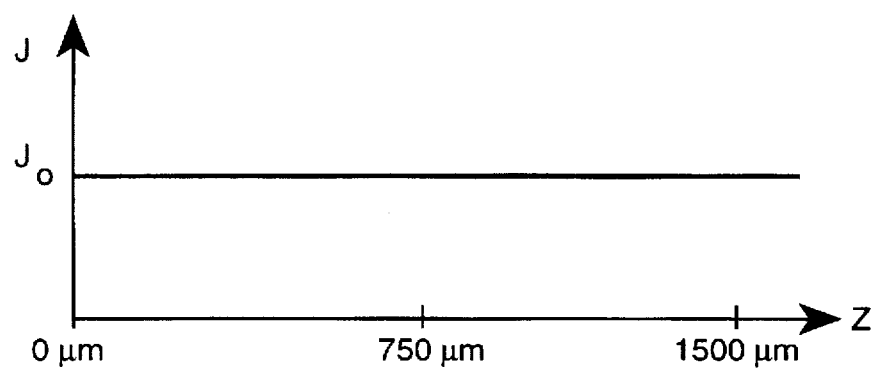
FIGS. 17a–c are graphs of current density versus amplifier position for three pumping profiles in accord with the present invention.

In the case of flared or broad area amplifiers, such as those shown in FIGS. 10–15, differential pumping along the longitudinal and transverse dimensions can lead to the following improvements. First, as for single mode amplifiers, high speed modulation can be obtained. Second, lower noise fed back into the laser is obtained. Third, unlike single mode amplifiers, flared or broad area amplifiers can exhibit modal distortion due to effects of both lateral and longitudinal thermal and charge distributions on the propagating amplified beam. For example, if the gain in the amplifier becomes too high at any point along the length of the amplifier, spatial hole burning in the gain will occur. This causes filaments to form in the amplifier, which causes phase front distortion and the lack of a good far field beam profile. Thus, it is desirable to tailor the gain along the length of the amplifier so that the beam is allowed to spread out before a high gain level is applied to the beam. Therefore, when the amplified beam can spread laterally it is also possible to achieve a higher coherent undistorted output power by pumping a greater current density near the output region than near the input region. A theoretical analysis for the three current profile cases illustrated in FIGS. 17a–c and verified by experiment shows that a uniform current density $J_0$ (FIG. 17a) in a 1500 μm long flared amplifier with 10 μm side input aperture and 160 μm wide output aperture will allow an output beam of about 300 mW cw power at 1.07 times the diffraction limit. Above that power level, distortion created at the input end of the amplifier causes the far field to broaden. However, pumping the amplifier with a differential stepped or graded current density (FIGS. 17b and 17c, respectively), where 0.3 $J_0$ is the current density for the input end of the amplifier and 1.7 $J_0$ is the current density for the output end of the amplifier, respectively allows up to 3.07 W and 2.66 W cw of output power to obtain a far field at 1.07 times the diffraction limit of the beam. Thus, differential pumping is highly beneficial to the creation of the high power coherent output.

Figure 10A:
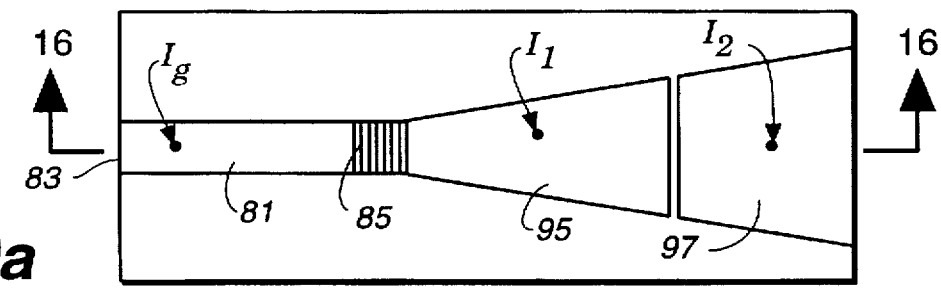
Figure 10B:
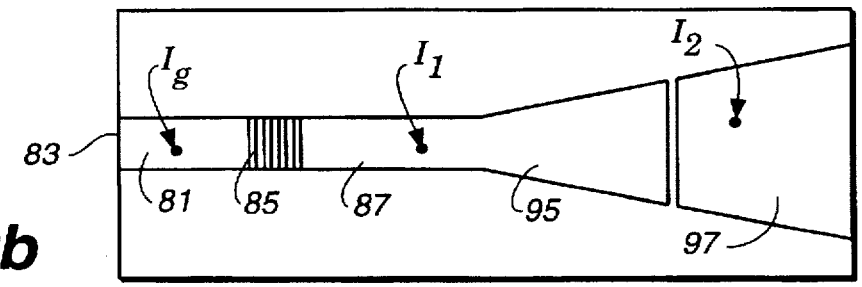

Referring to FIGS. 10a and 10b, a laser oscillator 81 with feedback grating 85 and a cleaved facet mirror surface 83 defining a laser cavity is coupled to a multimode optical amplifier, here shown as a flared amplifier, with an input end 95 and an output end 97. Separate contacts provide different currents $I_1$ and $I_2$ to the respective input and output ends 95 and 97 of the optical amplifier.

Figure 16:
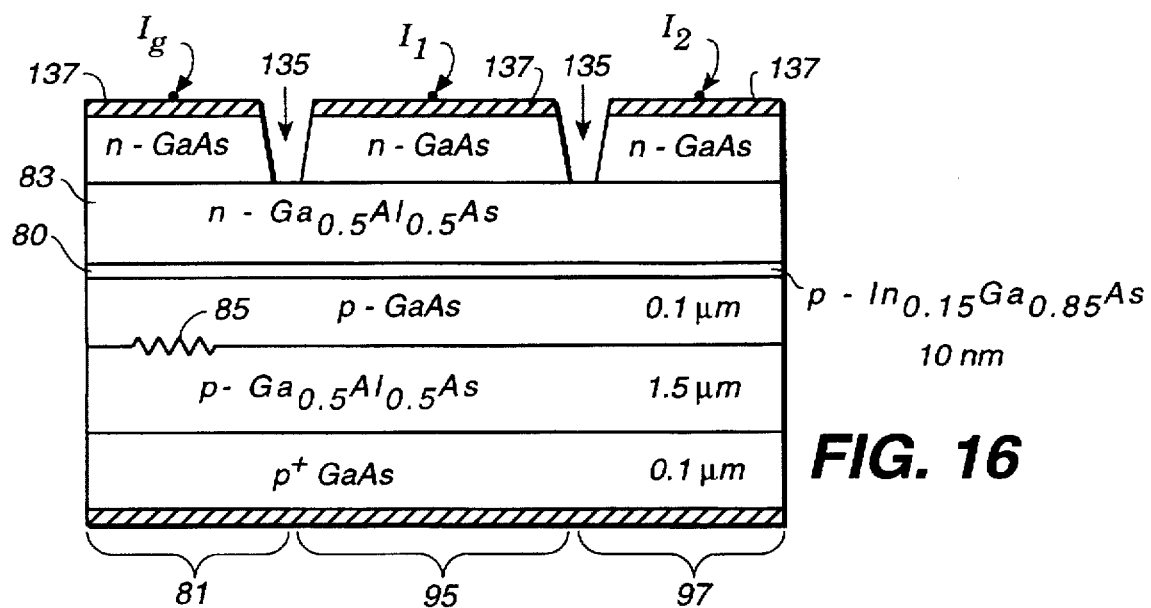
FIG. 16 is a side sectional view of the embodiment in FIG. 10, taken along the lines 16—16 in FIG. 10.

Graded pumping current distributions can be obtained by adding resistance near the amplifier input. One way to add resistance and therefore keep the current density lower is to add contacts 137 separated by slots 135 along the length, as seen in FIG. 16. FIG. 16 exhibits devices that are isolated on the n-side of the amplifier. However, isolated contacts could instead be fabricated on the p-side of the amplifier, for example, via H$^+$ implantation. The etched slots 135 or other resistive regions, such as those formed by implants, keep the currents $I_g$, $I_1$ and $I_2$ separate down to the waveguiding layers so that different current densities are injected through the various local areas of the active region 80. Laterally shaped contacts can also tailor the gain to optimize the coherent output power.

Figure 11:
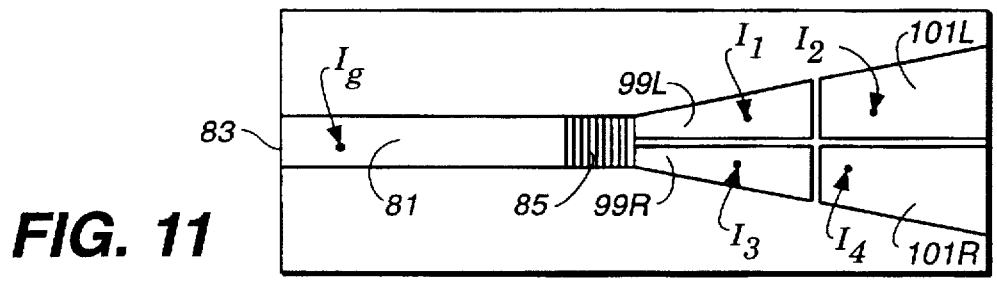

In FIG. 11, four separate contact regions 99l, 99r and 101l and 101r allow both longitudinal and lateral differential pumping of the flared optical amplifier with independent current levels $I_1$–$I_4$ provided to each region. As in FIG. 10, a lower current density for the regions 99l and 99r at the input end of the optical amplifier and a higher current density for the regions 101l and 101r for the output end of the optical amplifier produces a high power coherent light beam with reduced noise. Lateral differential pumping with a higher current density on one side 99l and 101l versus the opposite side 99r and 101r causes lateral deflection of the output beam by producing a lateral variation in refractive index in the waveguiding layers. Potentially, the number of contacts to regions 99l, 99r, 101l and 101r can be increased to further enhance beam steering or to minimize the effects of filamentation, or both.

Figure 12A:
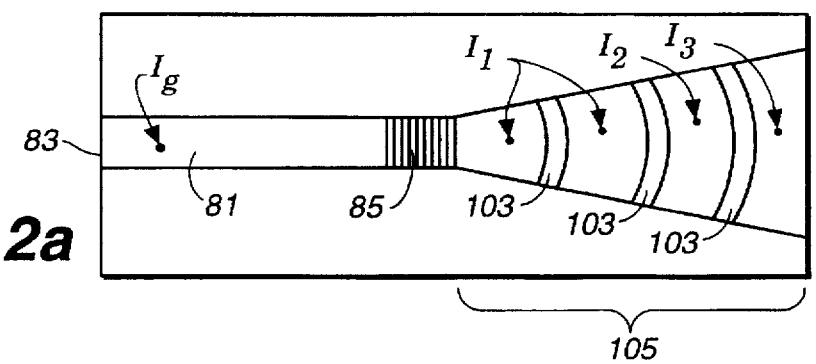
Figure 12B:
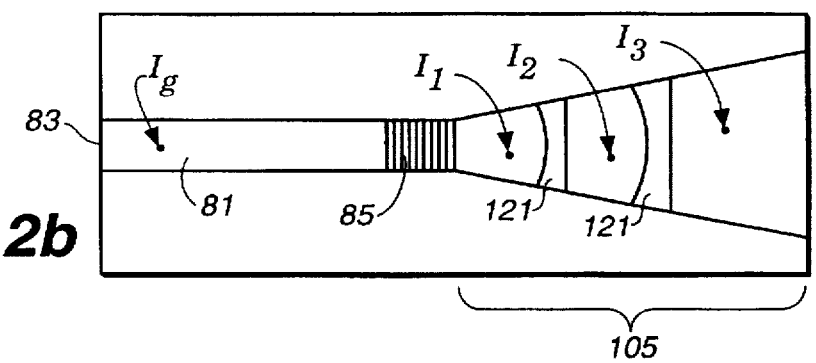
Figure 12C:
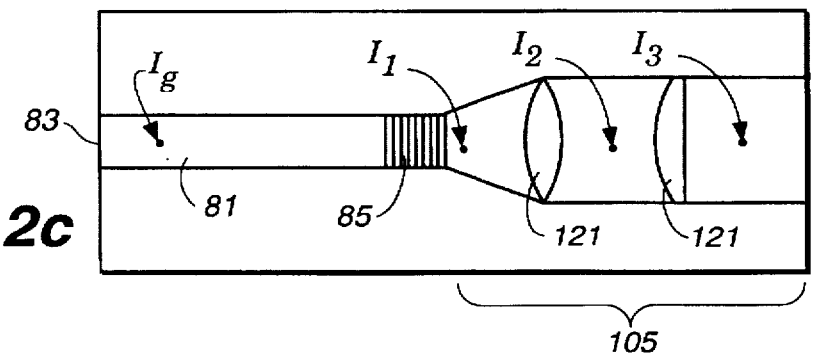

With reference to FIGS. 12a to 12c, resistive regions 103 could be formed in the flared waveguide 105 to vary the local resistance to the injected current $I_1$. Changing the size or spacing of the resistive regions 103 effectively alters the current density seen by the active gain region of the amplifier. The resistive regions can have a shape which is tailored to match the phase fronts of the light propagating in the amplifier to minimize phase distortion. Alternatively, the resistive regions would be shaped to deliberately cause focusing or defocusing, as in a lens, by altering the effective refractive index in selected areas as illustrated in FIGS. 12b and 12c. A combination of lenses causing defocusing of the light at the input end of the amplifier and focusing or collimation near the output end can further enhance high power coherent performance. Also, as in FIGS. 21–26, 30 and 31, the lateral waveguide of the amplifier can be used to refocus or collimate the amplifier beam.

Figure 13:
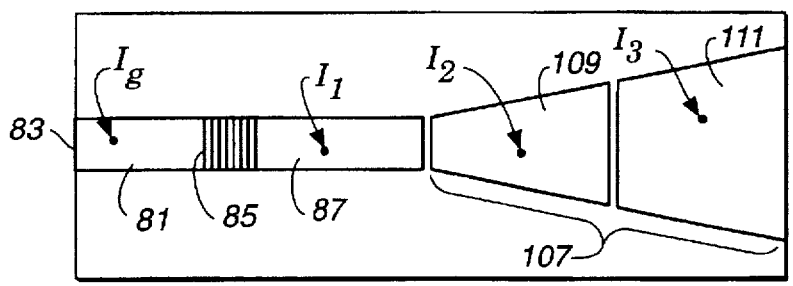

Referring to FIG. 13, the MOPA device may have a laser 81 pumped with current $I_g$, followed by a preamplifier section 87 pumped with a current $I_1$, followed by a flared amplifier 107, as in FIG. 1. The flared amplifier 107 could also be differentially pumped with a current $I_2$ at input end 109 and a current $I_3$ at output end 111. Preferably, the current density provided by injected current $I_2$ is lower than the current density provided by the injected current $I_3$. The preamplifier 87 may be pumped with a modulating current $I_1(t)$ rather than a fixed current. The modulation should be low enough to reduce noise from spontaneous emission in the flared amplifier sections 109 and 111, as well as low enough to reduce beam distortion as a result of thermal and charge distribution effects at the peak current levels. Modulating the preamplifier 87 rather than the laser 81 avoids a wavelength chirp common to most oscillators 81. The laser 81 could alternatively be a high Q laser with a grating 85 having greater than 40% reflectivity. The grating 85, tailored to have reflection at the peak $\lambda_0$ in the laser gain band, could be electrically pumped to be transparent at wavelength $\lambda_0$ while still having loss at other wavelengths in the gain band, thereby minimizing the wavelength chirp and reducing feedback noise into the laser. Then the laser 81 itself could be modulated with a modulating pump current $I_g(t)$ at very high modulation rates. The high Q laser has a low power output which is first amplified by single mode preamplifier 87 before entering the multimode flared amplifier 107.

Other types of modulation can also improve performance for certain applications. In AM modulated systems, laser linearity of output power versus input current is a critical parameter. Nonlinear operation causes second and third order harmonics of the modulation signal to be generated. Use of an amplifier with at least one contact separate from the laser can be used to improve linearity. For example, the output from the MOPA can be optically detected, sensed electronically for the undesired harmonic components generated by the nonlinearity and a partial signal may be fed back into at least one of the amplifier contacts to reduce the harmonic content. Conversely, different frequency signals can be applied to the laser or one or more amplifier contacts in order to generate frequencies owing to harmonics which could not otherwise be generated by the lower speed drive electronics providing the modulation.

Figure 14:
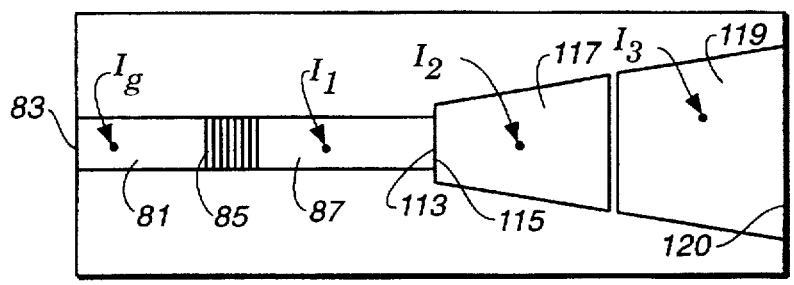

In FIG. 14, the output aperture 113 of the preamplifier section 87 does not match the mode size of the input aperture 115 of the multimode optical amplifier's input end 117. By broadening the input of the flared amplifier, the thermal gradient is reduced and the tendency to filament is also reduced. Typical dimensions for this embodiment are 1 µm–5 µm for the width of the waveguide defining the single mode laser oscillator 81 and single mode preamplifier section 87, 30 µm–500 µm for the length of the preamplifier section 87, 10 µm–20 µm for the width of the input aperture 115 of the optical amplifier, 500 µm–3000 µm for the total length of both input and output ends 117 and 115 of the optical amplifier and 160 µm–400 µm for the width of the output aperture 120 of the optical amplifier. However, those dimensions are not absolutely critical. In the case where a 2000 µm long amplifier is pumped with a current $I_1=I_2=165$ mA (J=200 A/cm$^2$) on the preamplifier 87 and the input half 117 of the amplifier and a current $I_3=4.0$ A (J=2000 A/cm$^2$) on the output half 119 of the amplifier, where $I_g=93$ mA and the input power provided by the preamplifier 87 is about 60 mW, the output power at output aperture 120 was found to be 1.8 W of diffraction limited light (FWHM=1.02× diffraction limit=0.223°) in an experimental InGaAs MOPA device. This compares favorably with the 200 mW–600 mW outputs provided by uniformly pumped amplifiers.

Figure 15:
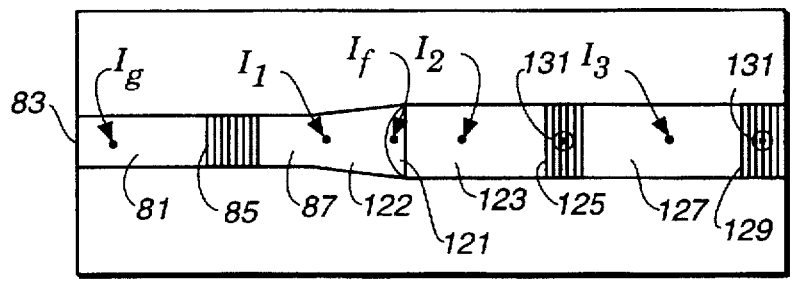

In FIG. 15, yet another embodiment includes a focusing lens 121 pumped with a focusing current $I_f$ to collimate the light received from the flared first amplifier 122. Alternatively, the index of refraction step that results in the lens 121 can be grown into the structure, for instance, via a two-step MOCVD growth process. The purpose of the lens 121 in this configuration is to collimate the light to match the subsequent broad area amplifiers. Successive amplifier sections 123 and 127 alternate with detuned surface emitting gratings 125 and 129 coupling out the light beams 131 from the amplifiers 123 and 127. Each amplifier section 122, 123 and 127 could be separately pumped with current $I_1$, $I_2$, and $I_3$, respectively. As in previous embodiments, the flared amplifier section 122 could be provided with a lower current density at its input end and in the single mode preamplifier section 87, if desired.

Figure 4:
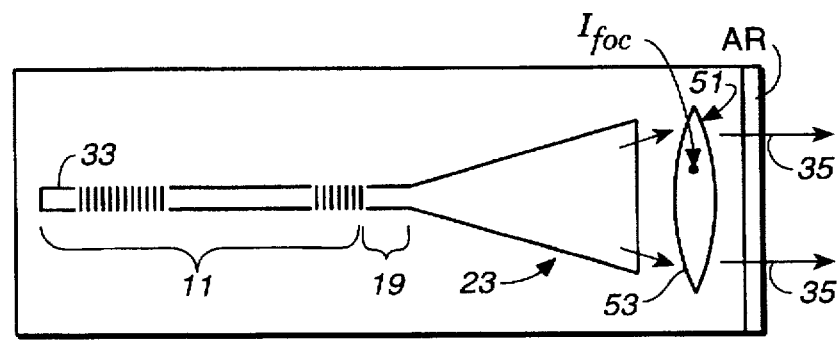

With reference to FIG. 4, the output of the flared amplifier 23 may be optically coupled to a monolithically integrated lens formed in the semiconductor body 9 for collimated emission. The integrated lens element 51 preferably has a separate conductive contact 53 that is electrically isolated from the flared amplifier 23. By varying the electric current $I_{foc}$ injected through the contact 53 into the lens 51, the refractive index of the lens region 51 can be varied so as to change the focal length of the lens 51. Accordingly, adjusting the current $I_{foc}$ allows the power of the lens to be matched to the divergence of the amplified light beam, so that the output 35 from the MOPA device is collimated under all operating conditions. Alternatively, the focusing power of the lens can be chosen to focus the beam to some external point, such as a single mode optical fiber.

Referring again to FIGS. 1 and 2, the region 31 at or beyond the end of the flared amplifier 23 and immediately adjacent to the output facet 27 may be a transparent window region that has been fabricated, for example, by impurity induced disordering, to have a higher bandgap than the active light emitting region 10 in order to minimize absorption loss of light passing through the window region 31. Such window regions substantially reduce catastrophic optical damage effects at the output facet 27, especially at high optical power densities, and lead to MOPA devices with longer operating lifetimes.

Figure 3:
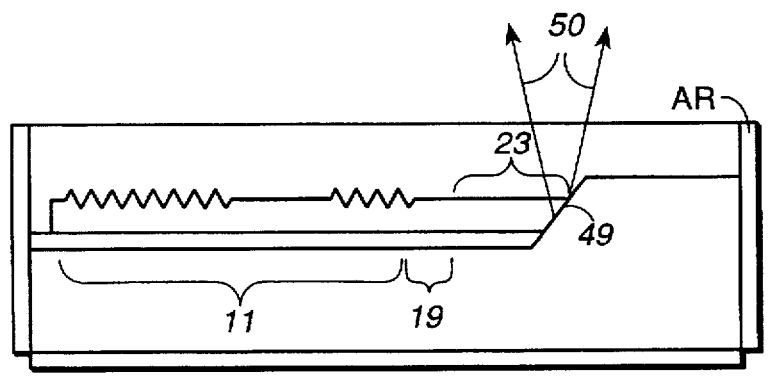
FIG. 3 is a side sectional view corresponding to that of FIG. 2 of an alternate MOPA embodiment of the present invention.

As previously described, the longitudinal axis 37 of the MOPA device can be at a nonperpendicular angle relative to the output facet 27 so that any reflection of the amplified beam off of the output facet 27 does not couple back into or otherwise interact with the laser oscillator 11. This reduction in feedback stabilizes the spectral and spatial mode of the output from the laser oscillator 11. The nonperpendicular relative orientation between facet 27 and axis 37 also eliminates optical filamentation and increases the self-oscillation threshold in the power amplifier 23. The output surface of the MOPA device can also be oriented so as to deviate transversely, rather than laterally, from an orientation perpendicular to the direction of propagation of the amplified beam. Referring to FIG. 3, the output of the flared amplifier 23 is reflected transversely toward a top or bottom surface of the MOPA device by a 45° mirror 49 defined in the semiconductor body by ion milling, etch-and-regrowth, or another known technique. The reflected light 50 is emitted through the MOPA surface. Because the light diverges outside of the transverse waveguide of the amplifier 23, any light that is reflected back toward the mirror 49 will have a very low probability of being coupled back into the amplifier 23. In yet another embodiment, the light could be coupled out of the MOPA device by a detuned surface emitting grating, as seen for example in FIG. 15. Active grating amplifiers, where a detuned grating is integral with the amplifier for simultaneous gain and surface emission, could also be placed after the flared amplifier. Each of these approaches could be used with the integrated lens embodiment shown in FIG. 4.

With reference to FIG. 5, a MOPA device with a laser oscillator 11 optically coupled through a preamplifier 19 to an optical power amplifier 55 is characterized by the amplifier 55 having a conductive surface contact 57 defining a gain region that is parabolically flared. That is, the width of the contact 57 and corresponding gain region increases along its length from a first width substantially matching the width of preamplifier 19 to a substantially larger second width at the light output facet 27, where the width corresponds to the square of the distance from the preamplifier 19, the edges of the amplifier gain region thereby describing parabolae.

Figure 6:
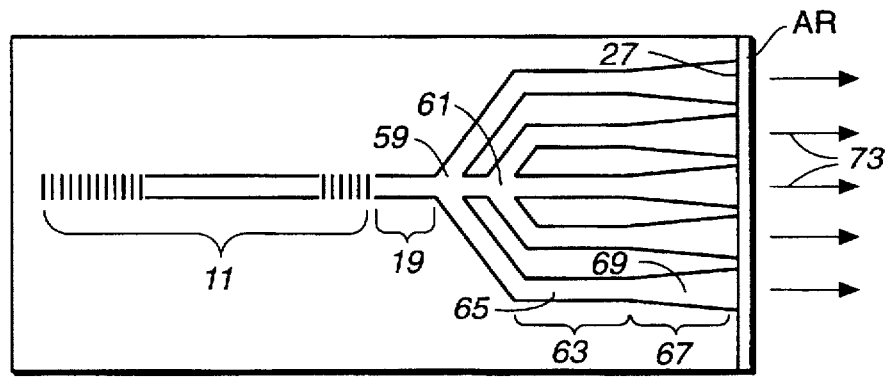

With reference to FIG. 6, the output of the laser oscillator 11 is coupled to a first preamplifier section 19 that branches at points 59 and 61 into multiple second preamplifier sections 63, each comprising a single mode waveguide 65 with conductive contacts over the waveguides 65 for optically pumping the preamplifier sections 63. An array of flared optical amplifiers 67 optically couple to the respective outputs of the preamplifier waveguides 65. The width of each amplifier gain region 69 in the array 67 matches at an input end the width of the preamplifier waveguides 65 and increases with the light divergence toward the output facet 27. Preferably, the gain regions 69 are sufficiently wide at the facet 27 to completely fill or nearly completely fill the entire width of the facet 27 with the emitted light 73 with little or no dark space between the adjacent light beam array elements. The facet 27 is preferably set at a nonperpendicular angle to the direction of light propagation in the amplifier array 67. In this fashion, it is possible to inject several flared amplifiers with a single laser oscillator, resulting in high power coherent output. In addition, the branching waveguides can be designed to have equal optical path lengths in order to produce equal phase at the output facets.

Figure 7:
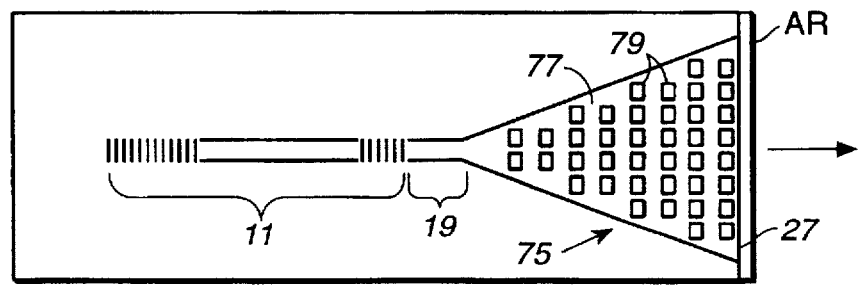

In FIG. 7, a single mode laser oscillator 11 is coupled via a single mode optical preamplifier 19 to a flared optical power amplifier 75. The amplifier 75 has a flared waveguide region 77 that expands in width with the divergence of light received from the preamplifier 19 and conductive contacts 79 that electrically pump the flared waveguide region 77. However, instead of a single unitary contact like the contact 41 for the flared waveguide 25 in FIGS. 1 and 2, the contacts 79 are multiple contacts which are electrically isolated from one another so as to be individually addressable. This allows the waveguide region 77 to be pumped with current densities that can be tailored to obtain a selected output profile. It also allows adjustments to be made in the amplifier pump pattern to compensate for varying operating conditions over time. Although it has been described as generally more desirable to have a lower current density at the amplifier's input end, there may be applications where a higher current density on the input side than on the output side is most beneficial.

The MOPA devices of the present invention may be mounted on a heat sink composed of a lower thermal resistance material, such as a diamond or a diamond film. Bonding the MOPA device to an efficient heat sink reduces thermal lensing effects in the flared power amplifier. Further, the heat sink mount can be patterned to match the expected pattern of heat generation by the MOPA device, thereby reducing any thermal gradients within the device.

Referring now to FIGS. 20–24 and 27–34, means are provided within the laser itself for altering the divergence of the light beam entering the multimode amplifier without the use of a preamplifier section. By increasing the beam divergence or by spreading out the beam prior to its reaching the multimode amplifier, spatial hole burning is decreased. Spatial hole burning is a phenomenon whereby an intense laser beam saturates the gain, causing an increase in charge density on either side of the beam and leading to filament formation and beam distortion.

Figure 20:
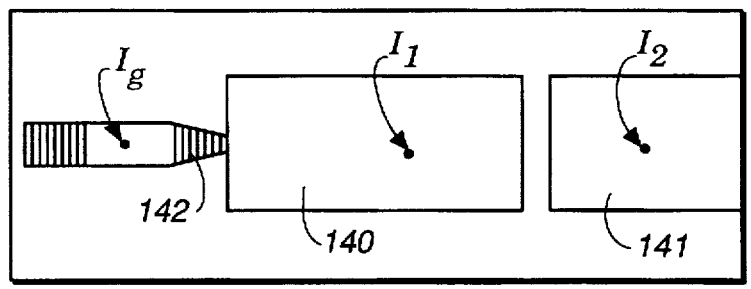
Figure 21:
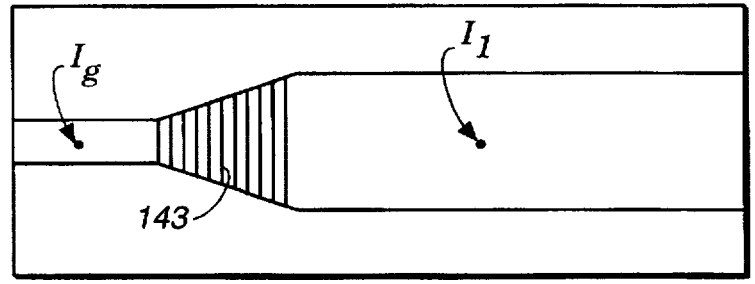
Figure 27:
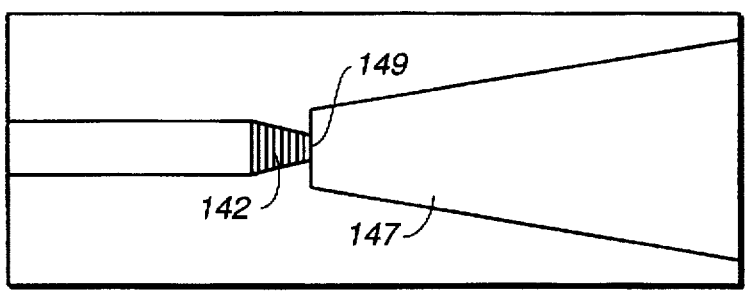

In FIG. 20, the decrease in lateral waveguide width at the output end of tapered feedback grating section 142 of the laser cavity causes the beam to diverge more rapidly as it leaves the laser. Section 142 can also be a tapered amplifier region for increasing the gain of the propagating lightwave as it is converged for output into amplifier section 140. Current $I_1$ and $I_2$ applied to the amplifier sections 140 and 141 may be identical or may be different. In FIG. 27, a tapered feedback grating section 142 produces a reduced aperture 149 at the laser output and causes a more rapid lateral beam spread in the flared amplifier 147. In FIG. 21, an increase in width of the laser's lateral waveguide at the output of grating and diverging input section 143 of the laser oscillator allows the beam to spread therein before it enters the amplifier. This improves high power coherent operation.

Figure 22:
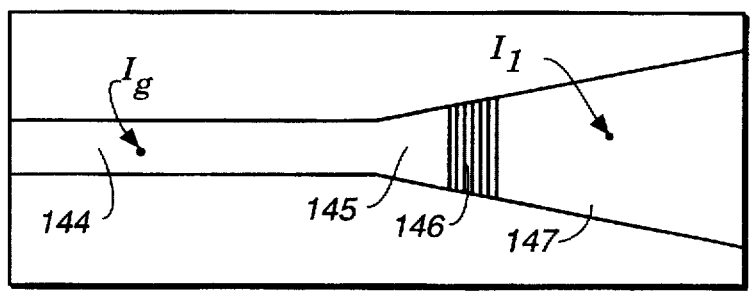
Figure 23:
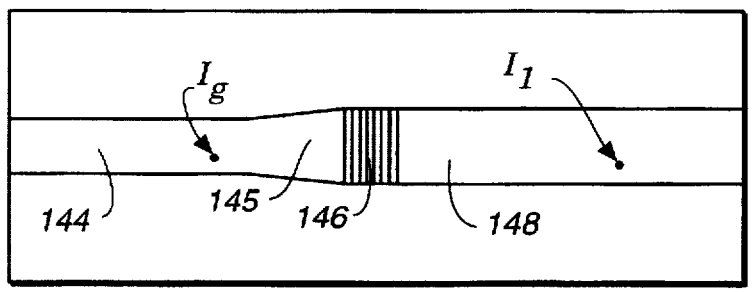
Figure 24:
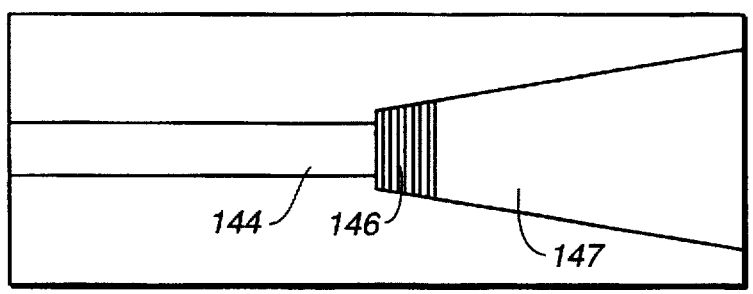

In FIGS. 22–24, the feedback grating 146 is located in an already expanded waveguide section. In FIGS. 22 and 23, the lateral waveguide 144 of the laser oscillator expands in region 145 before reaching the feedback grating 146. In FIG. 24, the waveguide width abruptly widens at the beginning of the grating 146. The amplifier to which the expanded beam couples could be a flared amplifier 147 or a broad area, rectangular waveguide, amplifier 148.

Figure 28:
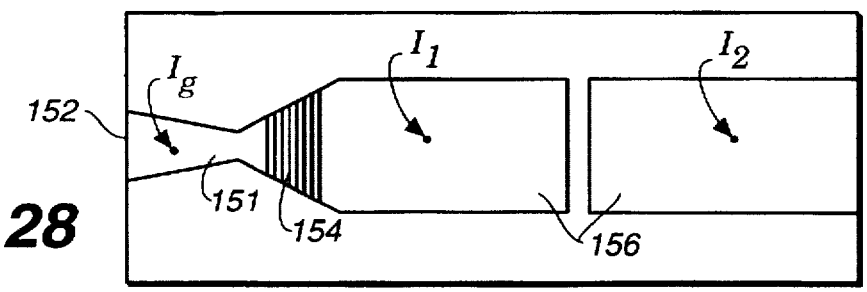
Figure 29:
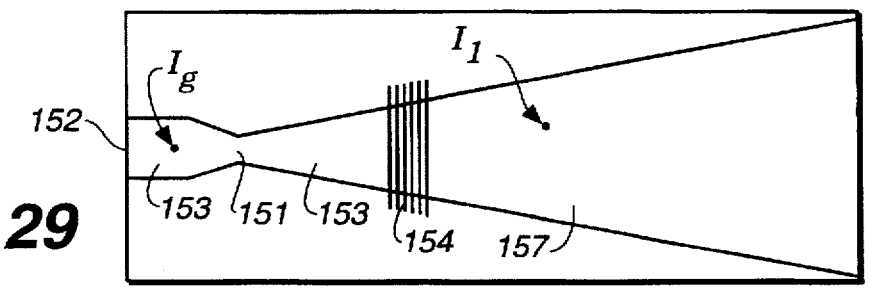
Figure 30:
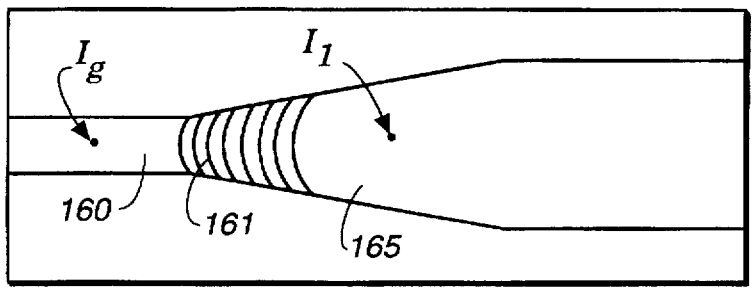

In FIGS. 28 and 29, a narrow region 151 in the lateral waveguide 153 of the laser oscillator defined by reflectors 152 and 154 causes the laser beam to spread more rapidly in the amplifier 156 or 157. This reduces the spatial hole burning which could be caused in the amplifier 156 or 157 by a localized laser beam that is too intense at the input to the amplifier 156 or 157. Typical width values for the lateral waveguide 153 of the laser range from 2 μm to 6 μm with a narrow region 151 of at most one micrometer width. Amplifier 156 is a broad area, straight or rectangular waveguide, amplifier, while amplifier 157 is a flared waveguide. Of course, any of these geometries could employ an amplifier with differential pumping by two or more applied currents $I_1$ and $I_2$. Alternatively, uniform pumping of the amplifier with a single current $I_1$ could also be used.

Figure 31:
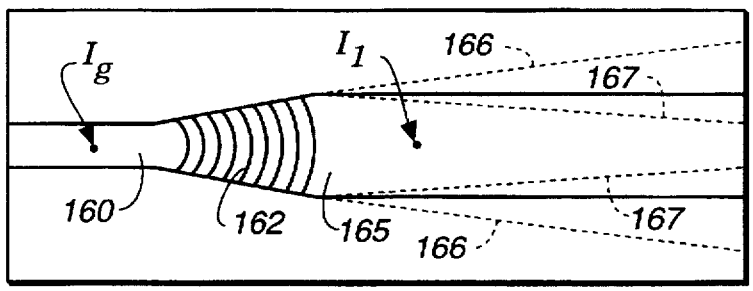
Figure 32:
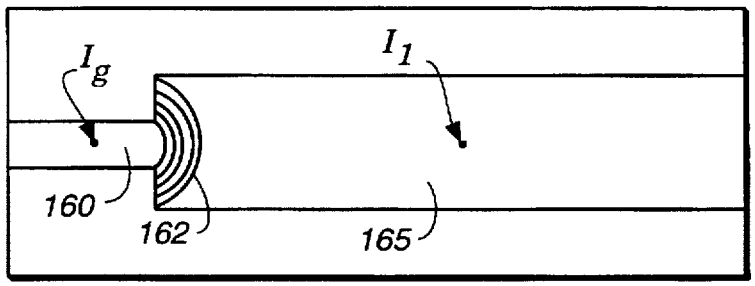
Figure 33:
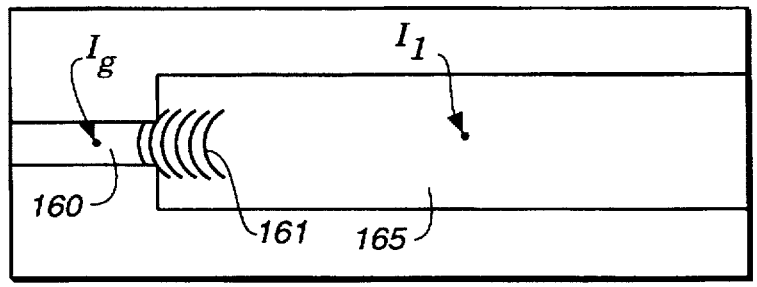

In FIGS. 30–33, the lasers 160 have a curved feedback grating 161 or 162. The curved gratings allow the laser beam to diverge upon entering the amplifier 165. The grating curvature can be chosen so that the tooth spacing and beam divergence match the mode in order to allow coherent feedback at the edges of the laser beam in the stable resonator cases shown in FIGS. 31 and 32. However, in the stable resonator, if the beam divergence and tooth curvature do not match, there may be multiple laser wavelengths emitted in different output directions. Depending on the application, this could be either desirable or undesirable. The unstable resonator cases shown in FIGS. 30 and 33 will only get feedback into the laser 160 from the central non-diverging light rays. However, in any unstable resonator, the beam will spread rapidly upon leaving the laser. This is desirable, because it reduces spatial hole burning in the amplifier 165. As seen in FIG. 31, the amplifier could be a straight amplifier as shown, or a flared amplifier indicated by dashed lines 166, or a tapered amplifier indicated by dashed lines 167.

In FIG. 34, a microcleave 171 could be used to provide feedback to a laser oscillator 173 with a flared waveguide. The laser could then be coupled to a flared amplifier 175. The microcleave 171 could be positioned in the flare, as shown, or in the parallel region of 173.

Figure 25:
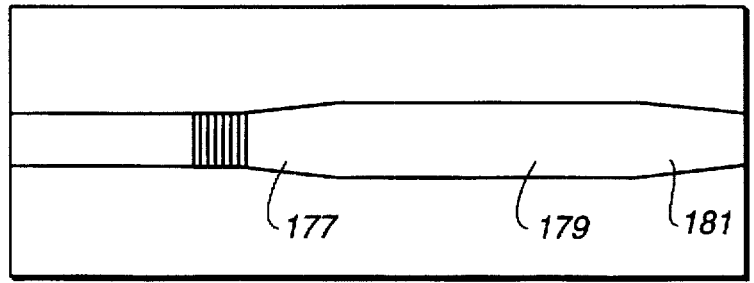
Figure 26:
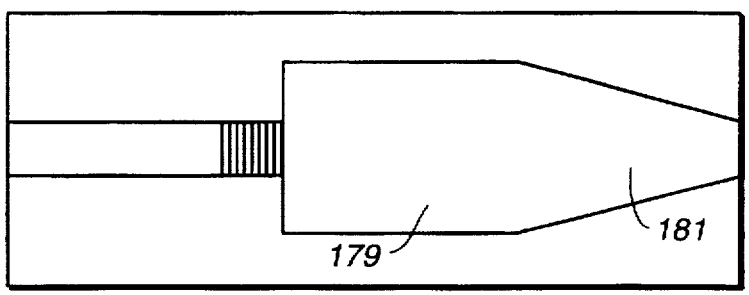

FIGS. 25 and 26 illustrate that the amplifier could have a tapered output section 181 to laterally reconverge the light beam after amplification. This provides a collimated beam in the far field by reducing the lateral phase curvature of the beam. The tapered amplifier section 181 takes the place of a lens. In FIG. 25, the amplifier first flares to an increased width in an input section 177, becomes a straight waveguide in central section 179 and then reconverges in output section 181. In FIG. 26, the flared input section 177 is absent, illustrating that the input end of the amplifier can be wider than the output end.

Figure 35A:
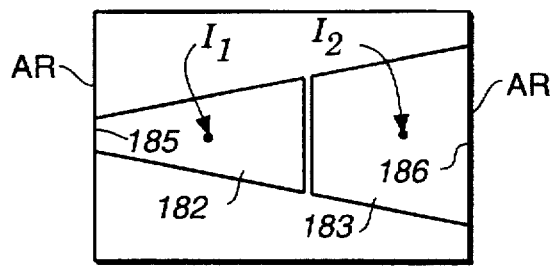
FIGS. 35a–35h are top plan views of amplifier chip embodiments of the present invention.

With reference to FIGS. 35a–h, the differential pumping which is characteristic of the present invention may also be applied to an optical amplifier semiconductor device or amplifier chip which has not been integrated with a laser oscillator. Such an amplifier chip can be optically coupled to an external laser source, as in the embodiments seen in FIGS. 36–38. In FIG. 35a, the amplifier chip includes a flared gain region which is divided into two separate pump sections 182 and 183. The pump sections may be defined by separate conductive contacts or by resistive regions within the semiconductor structure of the amplifier chip. The light received by the amplifier chip at its input end 185 is allowed to diverge as it propagates toward the output end 186, where it is emitted as a broad beam. The flared gain region defined by pumped sections 182 and 183 expands in width at a rate which equals or exceeds the divergence of the light, the light being either laterally unguided or gain guided. A multilayer waveguide encompassing the active gain region in the semiconductor chip provides vertical transverse waveguiding but generally does not provide any lateral waveguiding of the light. Any real refractive index structures that may be present at or near the edges of the flared gain region 182 and 183 is normally placed sufficiently away from the edges of the diverging light beam to avoid having any lateral waveguiding effect, and is either incidental to the operation of the amplifier or is provided for current confinement or some other purpose besides index guiding. As in the similar MOPA structure of FIG. 10a, the two pump sections 182 and 183 are independently supplied with current $I_1$ and $I_2$. Preferably, the current density in the first pumped section 182 is much less than the current density in the wider second pumped section 183 to avoid gain saturation, spatial hole burning, lensing effects, filament formation and other adverse optical effects that would lead to loss of coherence of the received light as it is amplified.

Figure 35B:
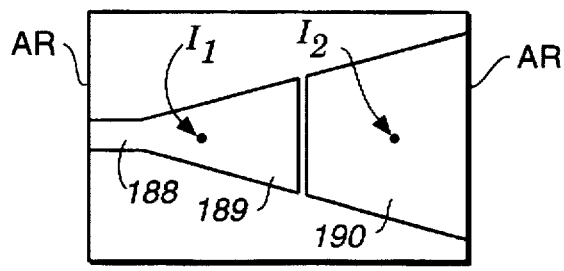
Figure 35C:
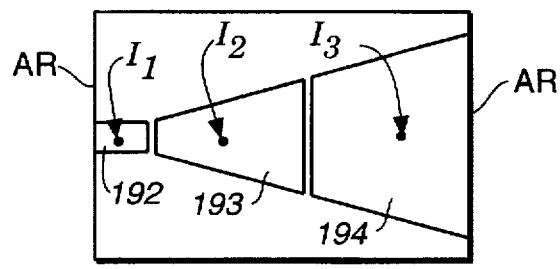
Figure 35D:
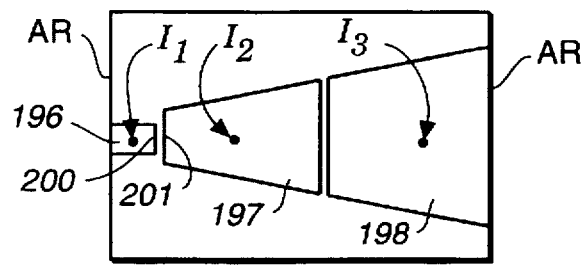

FIGS. 35b–35d show that a single mode preamplifier section 188, 192 or 196 may be provided at the narrower input end of the flared gain region. The single mode section may be gain guided, but is preferably index guided. In FIG. 35b, the preamplifier section 188 and the first portion 189 of the flared gain region are supplied with a first current $I_1$, while the wider second or output portion 190 of the flared gain region is provided with a second current $I_2$. In FIG. 35c, each of the three sections 192, 193 and 194 are independently pumped with currents $I_1$, $I_2$ and $I_3$. Thus, the preamplifier section 192 may receive a different current $I_1$, than either flared pump portion 193 or 194 to optimize the optical power coupled into the first portion 193 of the flared region. While the output of the single mode preamplifier section 192 and the input of the first flared portion 193 have the same width in FIG. 35c, FIG. 35d shows that the input end 201 of the first flared portion 197 may be wider than the output end 200 of the preamplifier section 196 to provide the injected light a chance to diverge freely without substantial edge effects. The amplifier chips in FIGS. 35b–35d are generally comparable to the MOPA devices seen in FIGS. 10b, 13 and 14 and already described.

Figure 35E:
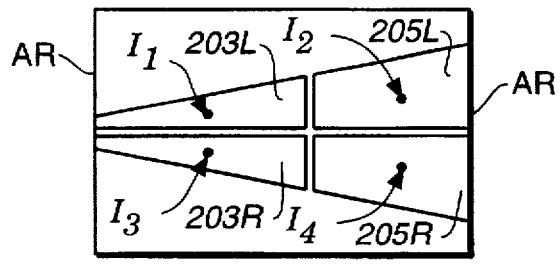

In FIG. 35e, it is seen that the differential pumping of the active gain region of the amplifier chip can be different both longitudinally and laterally. A first pumped portion of the gain region has left and right halves 203L and 203R which are independently supplied with current $I_1$ and $I_3$. Likewise, the second pumped portion or output portion of the gain region also has left and right halves 205L and 205R which are independently supplied with current density $I_2$ and $I_4$. As explained for the similar MOPA embodiment in FIG. 11, lateral differential pumping allows the output direction of the amplified beam to be steered by producing a lateral variation in refractive index that deflects the beam to one side or the other by an amount that depends on the difference in left and right current densities in the gain region.

Figure 35F:
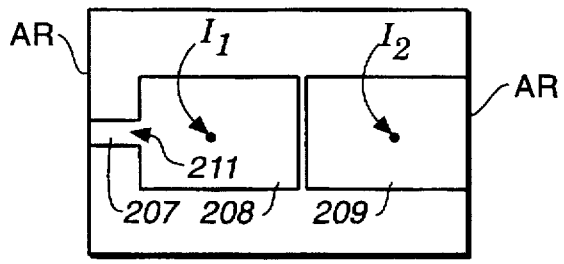

In FIG. 35f, a single mode preamplifier section 207 is optically coupled to a rectangular broad area amplifier section having two pumped sections 208 and 209 for differential pumping. The output 211 of the preamplifier section 207 is narrower than the width of the first portion 208 of the broad area rectangular region 208 and 209. The two portions of the amplifier 208 and 209 are independently pumped with current $I_1$ and $I_2$. The preamplifier section 207 may receive the same current $I_1$ as the first amplifier portion 208, as shown, or may be independently pumped, as in FIG. 35d.

Figure 35G:
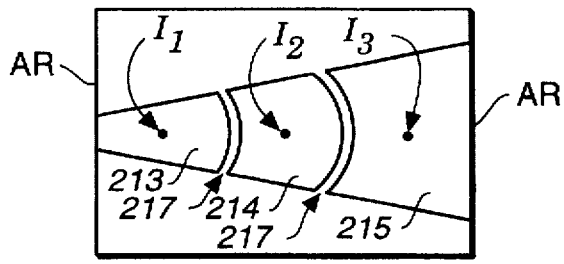

FIG. 35g shows an amplifier chip comparable to FIG. 12a having a pumped flared gain region with three pump sections 213–215 independently supplied with current $I_1$, $I_2$ and $I_3$. The contacts or resistive regions defining the separate pump sections 213–215 may be shaped so that their boundary spaces 217 match the phase fronts of the diverging light propagating in the flared region.

Figure 35H:
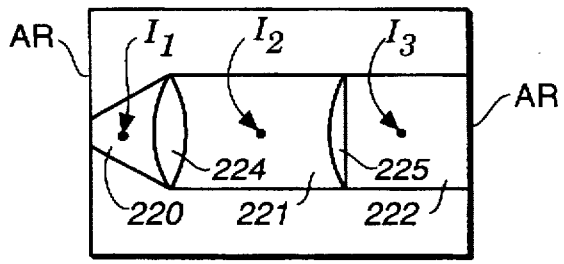

FIG. 35h, the shapes of the conductive contacts or of resistive regions within the amplifier chip's structure have been deliberately formed to define lenses 224 and 225 between independently pumped gain regions 220, 221 and 222. Alternatively, the lenses may be formed with real refractive index structures in the amplifier chip. The lenses 224 and 225 alter the divergence of light propagating in the pumped gain regions 220–222, causing focusing or collimation of the light, or even defocusing or increased divergence of the light.

With reference to FIGS. 36 and 37, the amplifier chips in FIGS. 35a–h are optically coupled to a coherent light source which is external to the chip 227. Here, the coherent light source is a laser diode 228. Collimating and focusing optics, such as lenses 229 and 230, are typically provided to improve coupling of the laser light into the gain region 237 of the amplifier chip 227. An optical isolator 231, typically a Faraday rotator, may be provided in the optical path between the laser diode 228 and amplifier chip 227 to reduce back reflection into the laser 228. The laser diode 228 may be mode locked or frequency tuned, if desired.

The amplifier chip 227 consists of a multilayer semiconductor structure including an active gain region 237 and a waveguide (cladding layers 236 and 238) encompassing the active gain region 237. These and other layers 236–239 are disposed on a substrate 235 with conductive contacts 240–243 on the bottom surface of the substrate 235 and the top surface of the cap layer 239 for injecting current into the structure to excite the active gain region 237. As seen in the top plan in FIG. 37, the amplifier chip used in this example corresponds to that shown in FIG. 35c. However, any of the other differentially pumped amplifier devices in FIGS. 35a–h could also be used.

FIG. 38 shows that the amplifier chip 247 may be pumped by a solid-state laser 245. For example, a neodymium solid-state laser 245 emitting at 1.06 μm may be used with an amplifier 247 that has a strained InGaAs active gain region with a gain band that peaks around 1.06 μm. The laser 245 may be pumped with a laser diode 248 emitting 810 nm pump light which is coupled into a neodymium doped solid-state laser rod 251 via coupling optics 249 and 250. The rod 251 has its input end 252 coated for low reflectivity at the pump wavelength, i.e. 810 nm, and high reflectivity of the solid-state laser wavelength, i.e. 1.06 μm. The other cavity mirror for the laser 245 may be a reflective concave surface 254 on a glass lens base 253 so that the laser output is approximately collimated. An optical isolator 255, such as a Faraday rotator, reduces feedback into the laser 245 from the amplifier chip 247. A focusing lens 256 may be used to couple the laser light into the input section 257 of the amplifier chip. The solid-state laser may be pulsed or mode-locked, if desired.

In any of these embodiments seen in FIGS. 35a–h and 36–38, the input portion of the amplifier or the preamplifier section, if present, or both may be electrically modulated to allow modulation of the light at high speed. This is of particular advantage in the solid-state laser embodiment in FIG. 38, since high speed modulation is not easily obtained from solid-state lasers. Thus, the amplifier chip could be used to provide modulated amplification of the laser light. Separate contacts for the differential pumping of the amplifier allows only the input portion to be modulated, instead of the entire amplifier gain region, so that smaller modulation currents are needed and higher modulation frequencies are possible.

Figure 17B:
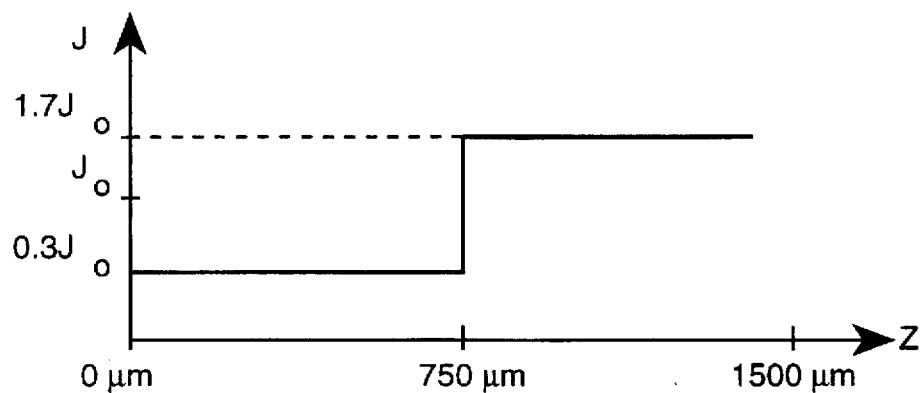
Figure 17C:
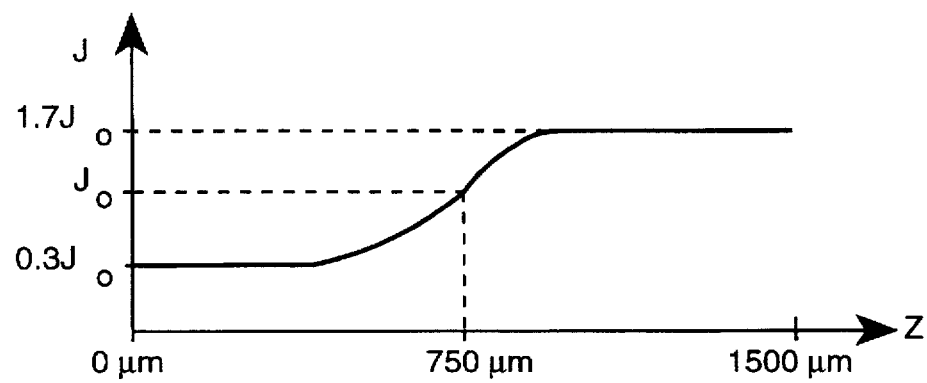

Previous reference has been made to differential pumping or graded pattern pumping distributions with representations of both longitudinal and lateral graded patterns in optical gain medium devices. For example, differential pumping pattern in the embodiment of FIG. 12b monotonically increases in size toward the output of the device in diverging gain medium section 105, as is true for linear gain medium section 93 in the embodiment of FIG. 9. The same is further true for the diverging gain regions 109, 111 and 117, 119 of FIGS. 13 and 14, respectively. In other words, the contact regions are of increasing size in progression toward the output end of the device, albeit the pattern distribution consists of two or more isolated contact regions. Also, in the embodiment of FIG. 12b, the differential pumping pattern monotonically decreases laterally from a central longitudinal axis of the device as indicated at the amplifier section pumped with current $I_2$. The opposite is true for the embodiment shown in FIG. 12c where the differential pumping pattern monotonically increases laterally from a central longitudinal axis of the device as indicated at the amplifier section pumped with current $I_2$. As previously indicated relative to FIGS. 17b, 17c, the diffraction limited performance of the output beam as well as its output power is significantly improved by the a differential pumping pattern having a pattern distribution that is step or graded to have a current density pattern that is lower at the input end portion of the gain medium than the output end portion, compared to the case shown in FIG. 17a where there is a single uniform contact providing uniform current distribution along the length of the gain medium device. Moreover, the provision for a lower current pumping at the input end portion of a gain medium is to provide approximately zero modal gain in this region where the propagating light is close to zero divergence, e.g., within one or two Rayleigh ranges. Thus, higher diffraction-limited performance in both linear or diverging gain media can be improved and spatial hole burning leading to filamentation growth in the case of diverging gain media and broad area linear gain media can be reduced by providing a pumping pattern that has a substantially step function in it, as illustrated in FIGS. 17b, 17c which can be accomplished with differential excitation, via $I_1$ and $I_2$ as, for example, in the embodiments illustrated in FIGS. 9, 10 13 and 14. However, these pumping pattern distribution approaches have not taken into consideration of reduced linewidth enhancement factor, $\alpha_{lw}$, which is a key parameter in the reduction of filamentation growth in broad area, linear stripe gain media or diverging gain media. It is, therefore, highly desirable to provide consideration of pumping pattern distributions that will reduce the linewidth enhancement factor, $\alpha_{lw}$, and thus the filamentation growth along the whole length of the gain medium cavity as well as consideration laterally of its length. This can be accomplished by utilizing pumping pattern distributions that result in more balanced enhancement of the modal gain, i.e., gain flattening, experienced along the length of the gain medium.

Figure 39:
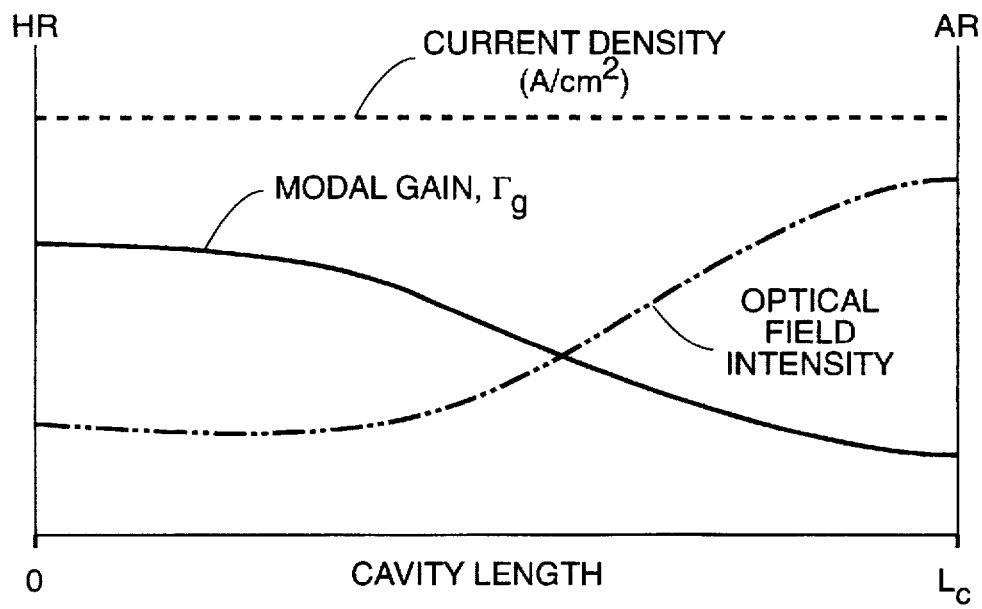
FIG. 39 is a schematic illustration of the modal gain, current density, and optical field intensity profile along the length of an optical gain medium when employing when employing a single contact gain stripe.

FIG. 39 illustrates, in schematic form, the case of a gain medium, applicable either to a laser diode (e.g., unstable resonator) or an optical semiconductor amplifier having single contact stripe or contact region, with a HR/AR configuration, i.e., a rear facet of high reflectivity and front facet having an anti-reflecting coating. Practically all lasers are designed to operate in an HR/AR configuration. As can be seen from FIG. 39, the optical modal gain distribution along the length of the medium is nonuniform or unbalanced while the current density along the gain medium length is, of course, is substantially constant. Since one facet is high reflecting and the other facet has very little reflectance, the optical field intensity profile will be highly nonuniform resulting in a modal gain profile that approximates a mirror image of the optical field intensity profile and is also strongly nonuniform. This strong asymmetry in the modal gain leads to detrimental effects within the optical cavity of the gain medium. For example, in regions where the modal gain is high, such as HR end portion shown in FIG. 39, and also along the longitudinal edges of the pumping contact or region of the gain medium, the effective linewidth enhancement factor, $\alpha_{lw}$, will be very high since the linewidth enhancement factor, $\alpha_{lw}$, can increase dramatically with increased modal gain, particularly in cases where the gain medium includes a superlattice or multiple quantum well structure in the device active region. Higher values of the effective linewidth enhancement factor, $\alpha_{lw}$, leads to larger index changes along the length of the cavity which may result in undesirable kink levels in the optical power/current characteristics of the device, higher wavelength linewidth in the output and increased filamentation particularly in broad area linear or diverging stripe devices. This section of high modal gain is a primary limitation toward further improvement of the diffraction limited performance and power output of the device since the effective linewidth enhancement factor, $\alpha_{lw}$, grows hyperlinearly with increasing modal gain accompanied with undesirable filamentation enhancement.

Figure 40:
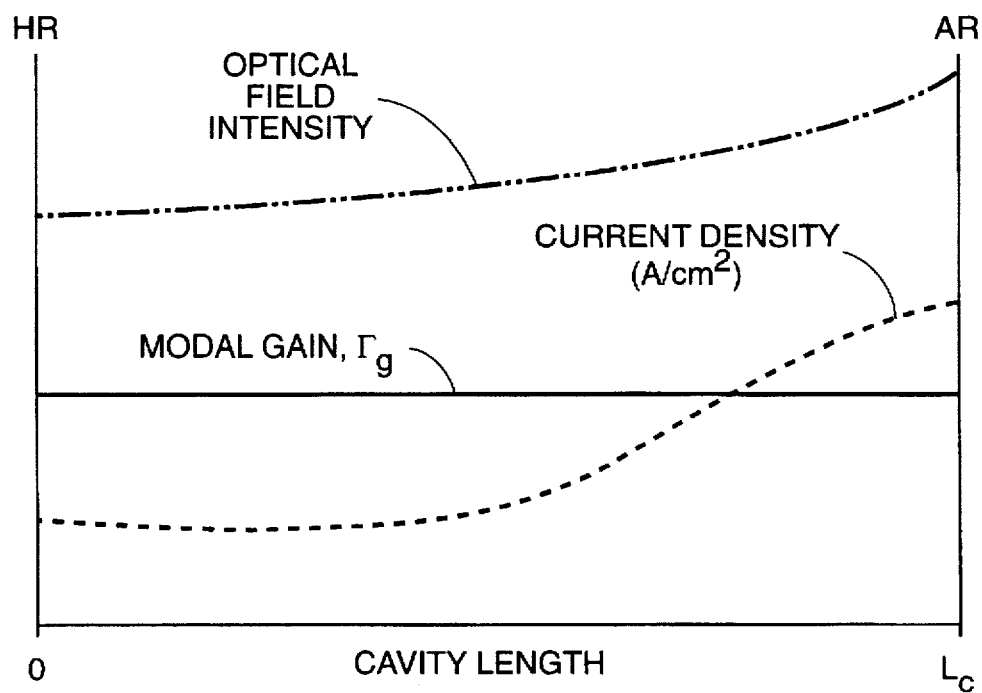
FIG. 40 is a schematic illustration of the modal gain, current density, and optical field intensity profile along the length of an optical gain medium when employing differentially pumped segmented pumping pattern along the gain stripe that provides for enhanced modal gain profile balancing.

An improved approach is illustrated, in schematic form, in FIG. 40 where the current density applied along the length of the optical cavity is patterned n a manner to control the modal gain longitudinally, or laterally, or both, along the length of the gain medium so that the resulting optical modal gain profile is more uniform or at least substantially closer to such uniformity along its length, particularly as compared to the case of modal gain in FIG. 39. The optical field intensity profile is similar to that in FIG. 39 but less pronounced. However, high power levels are now achievable due to a reduction in the peak modal gain which automatically reduces the effective linewidth enhancement factor, $\alpha_{lw}$. The result of uniform modal gain is a significant delay and degradation in the detrimental effects due to spatial hole burning in DFB and DBR lasers as well as in broad area pumped linear or diverging gain media. In turn, filamentation in these structures is significantly reduced, if not eliminated, enhancing their optical power output performance and power output while substantially increasing their useful life expectancy.

Figure 41A:
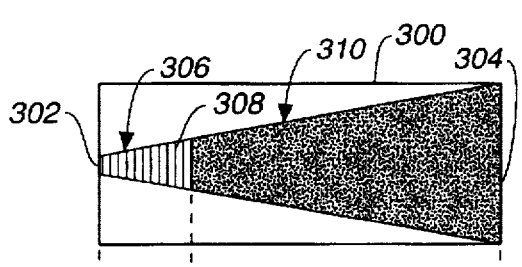
FIG. 41a is plan view of a diverging gain medium employing differential pumping pattern distribution with a uniform but low pumping density pattern at its input end portion and a uniform pumping pattern over the remaining portion having a current density fill factor distribution as shown in FIG. 41b.
Figure 41B:
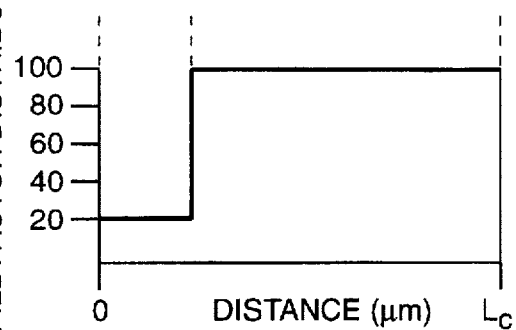

FIGS. 41a and 41b illustrate a diverging gain medium 300 permitting the propagating light to diverge toward output end 304, which may function as an optical semiconductor amplifier for amplifing light provided at its input end facet 302 or may function as an unstable resonator where facets 302 and 304 together provide partial internal reflection of propagating light within amplifier 300. The input end portion 306 of medium 300 is provided with a uniform pumping pattern comprising a plurality of spatial pumping strips 308 providing a current fill factor distribution, for example, of about 20%, as shown in FIG. 41b. The remaining portion 310 of diverging gain medium 300 is a single contact, diverging pumped region providing a current fill factor distribution of about 100%, as shown in FIG. 41b. Such an optical amplifier is shown in FIG. 6c in U.S. Pat. No. 5,392,308, which patent is assigned to the assignee herein and is incorporated herein in its entirety by reference. Amplifier 300 may also have a single mode filter as illustrated in FIG. 6b of that patent, or may comprise a master oscillator power amplifier (MOPA) device with a single mode section oscillator section integrated with the amplifier as a monolithic device or may be a discrete, separate device positioned in an external optical resonator cavity that includes amplifier 300.

It should be realized that in the illustrated gain medium 300 of FIG. 41a, patterned portion 308 is optional and not a requirement. Thus, for the purposes of this invention, particular reference and importance is to the modal gain profile in portion 310 of FIG. 41a, as seen in curve 312 in FIG. 43 (or portion 340 in FIG. 42a, as seen in curve 314 in FIG. 43). Uniform patterned portion 306 is desired from the standpoint of providing a low amount gain to the propagating light as it enters the input end of diverging gain region 310, permitting the propagating light to initially diverge in the body of amplifier 300 before "hard", full pumping of the propagating light. The use of section 306 improves the quality of the output beam profile. Thus, the modal gain is comparatively much lower in portion 306 compared to portion 310 as indicated in FIG. 41b and by curve 315 in FIG. 43.

As a specific example, amplifier 300 may have a cavity length, $L_c$, of 2,000 µm, the first 800 µm of which is portion 306 pattern pumped at 20% and portion 310 pattern pumped at 100%. The modal gain along the length of the cavity of the device when biased at 3A will change from a value below 10 $cm^{-1}$ in portion 306 to over 35 $cm^{-1}$ in portion 310, providing, for example, an average modal gain value in portion 310 of about 27 $cm^{-1}$. As a result, the modal gain drops sublinearly along the length of the cavity to a value below 20 $cm^{-1}$ due to increasing optical power density. In FIG. 43, curve 312 shows the modal gain profile for amplifier 300. As previously indicated in connection with FIG. 39, the portion of medium 300 having high modal gain is a primary factor toward achieving further improvements in diffraction limited power since the effective line width enhancement factor, $\alpha_{lw}$, grows hyperlinearly with increasing modal gain. Filamentation growth rate increases significantly fast with increasing modal gain. In this connection, it should be noted that in amplifiers of the type shown in FIG. 41a, absent patterned pumped input portion 306, the modal gain peaks at the beginning of amplifier region 310, as illustrated at 313 of the modal gain curve 312 in FIG. 43, which is the worst of all possible modal gain distributions since filamentation hyperlinearly increases with high modal gain. Therefore, any reduction of the peak modal gain value along the length of the amplifier will lead to an improvement of the diffraction limited performance with corresponding decrease in filamentation at typical operating current levels and output power levels while also safely permitting a further increase in those operating levels. Idealized modal gain reduction would be complete gain flattening as represented by curve 316 in FIG. 43, assuming no optical noise or thermal effects, but the effects of this invention are achieved by employing the stripe monotonic patterning described in FIGS. 42a an 42b which effectively reduces the peak modal gain providing a corresponding reduction in linewidth enhancement factor, $\alpha_{lw}$, so that the modal gain profile throughout the gain medium pumped region is more balanced and more evenly distributed. However, it should be realized that perfectly flat modal gain, as represented by 316, would be difficult to achieve which, in any case, is not required to achieve the goals of this invention including a reduction of the peak modal gain across the modal gain profile.

Figure 42A:
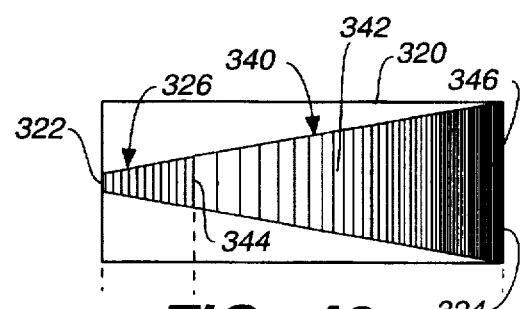
FIG. 42a is plan view of a diverging gain medium employing differential pumping pattern distribution with a uniform but low pumping density pattern at its input end portion and a longitudinally, monotonically increasing pumping distributed pattern over the remaining portion having a current density fill factor distribution as shown in FIG. 42b.
Figure 42B:
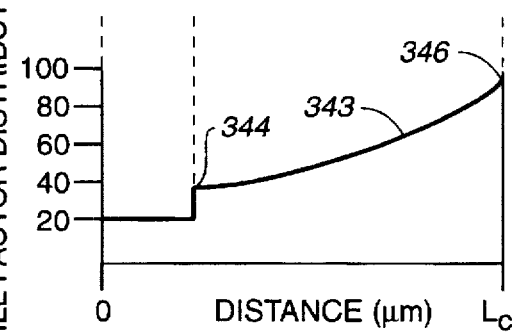
FIG. 42c shows the uniform low pumping density pattern of spatial pumping strips of uniform width.
Figure 43:
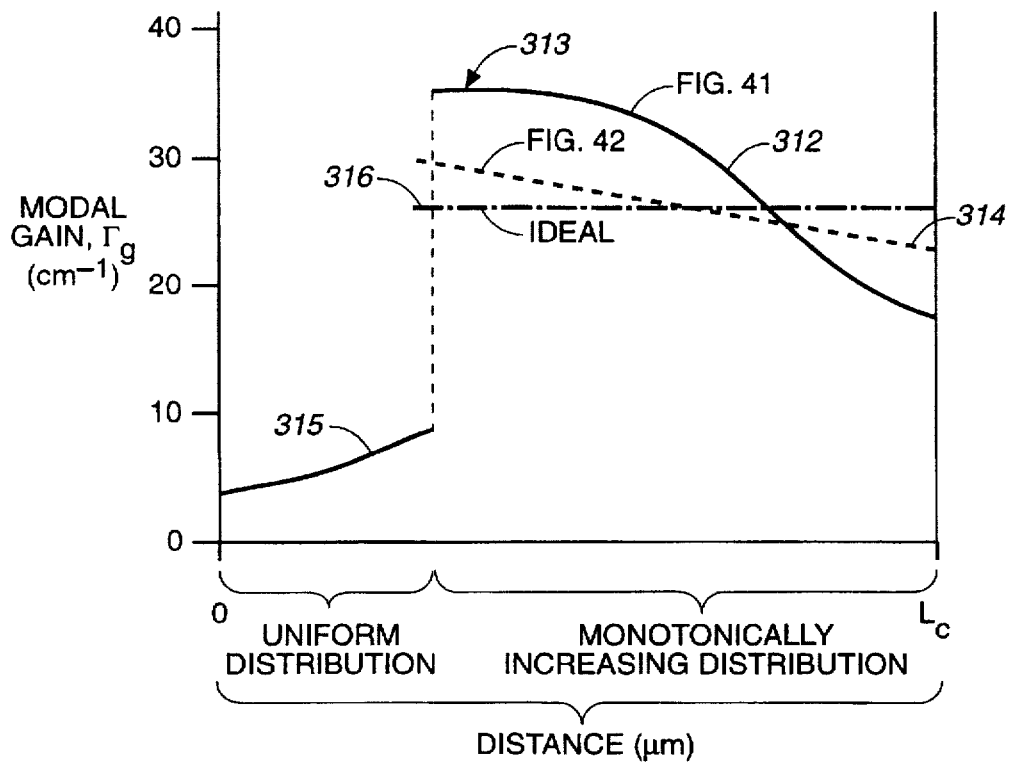
FIG. 43 is a modal gain graphic illustration showing the resulting differences in modal gain along the length of the gain medium respectively for the pumping pattern distributions of FIGS. 41 and 42.
Figure 42C:
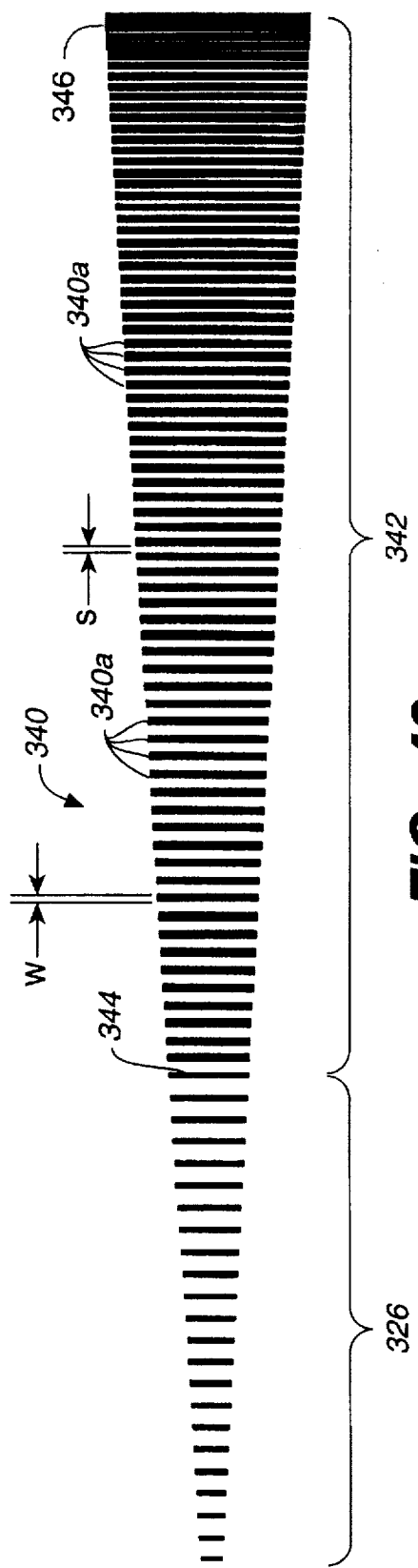

FIGS. 42a and 42b illustrate one manner of achieving substantial modal gain balancing and gain distribution that is more uniform. Gain medium 320 is structurally the same as medium 300 except for montonically produced pumping distributed pattern 342 in diverging gain or amplifying section 340. Diverging gain medium 320 permits propagating light to diverge toward output end 324, which may function as an optical semiconductor amplifier for amplifying light provided as an input at its end facet 322 or may function as an unstable resonator where facets 322 and 324 together providing partial internal reflection of propagating light within amplifier 300. The input end portion 326 of medium 320 is optionally provided with a uniform low pumping density pattern comprising a plurality of spatial pumping strips 308 providing a current fill factor distribution, for example, of about 20%, as shown in FIG. 42b. The remaining portion 340 of diverging gain medium 320 is also patterned at 342 to provide longitudinally, monotonically increasing the averaged current distribution along the length of amplifier portion 340, as illustrated at 343 in FIG. 42b, starting with a current fill factor distribution at 344 of about 40% and monotonically increasing to a current fill factor distribution of about 100% at 346, also illustrated in FIG. 41b. By "monotonically increasing", we mean a linear or nonlinear increase, the former being a straight-line increase, and the latter being, for example, exponential-like or parabolic-like in nature, i.e., a substantially monotonic increase in total current density progressively along the direction of propagating light in gain medium 320. A nonlinear increase is preferred. The pumping pattern may be comprised of a plurality of laterally, adjacently disposed, thin pumping stripes 340A that may of uniform width with monotonically decreasing inter-stripe spacing, S, toward end 346 or, alternatively, of montonically increasing stripe width, W, toward end 346, illustrated later in connection with FIG. 44. An enlarged view of monotonic distributed pumping pattern 342 is shown in larger detail in FIG. 42c than in FIG. 42a. In FIG. 42c, the pumping stripes 340A may be of uniform width with monotonically decreasing inter-stripe spacing, S, or montonically increasing stripe width, W, with uniform inter-stripe spacing, S. FIG. 42c shows the uniform low pumping density pattern of spatial pumping strips 340A of uniform width, W, and monotonic decreasing the inter-stripe spacing, S.

The monotonically increasing pumping pattern 342 in amplifying section 340 provides an averaged distributed, monotonic increase of current density reducing the spatial local modal gain maxima across the modal gain profile, as indicated by tilted line 314 in FIG. 43, which reduces the effective linewidth enhancement factor, $\alpha_{lw}$, which eliminates the tendency for filamentation. As can be seen from FIG. 43, line 314 is a significantly more uniform modal gain profile compared to curve 313 for the case of FIG. 41.

Other alternatives are possible, such as, that only a portion of amplifier section 340 need include a monotonically increasing pumping pattern, similar to pattern 342 in FIG. 42c, rather than extend the entire length of the section. Also, either end portions 344 or 346 or both of pumping distributed pattern 342 may have different rates of monotonical change in pattern distribution so that the exponential-like rate of change may be slower or faster than the rate of that portion of the pattern distribution between these end portions, e.g., the pattern may be chirped. Further, the end portion at end 346 of pumping distributed pattern 342, such as several tens of microns, may be solid pumping stripe region so the propagating light 100% or fully pumped prior to exiting gain medium 320. The presently preferred, basic approach for pattern 342 is illustrated in FIG. 42c.

As a specific example, amplifier 320 may have a cavity length, $L_c$, of 2,000 µm, the first 800 µm of which is portion 326 pattern pumped at 20% and portion 340 montonically pumped from between 40% at end 344 to 100% at end 346 balancing the modal gain profile, shown at 314 in FIG. 43, to a value of about 27 cm$^{-1}$. Thus, this type of patterned pumping reduces the peak modal gain to its minimum level, under conservation of the total optical output power, reducing the tendency for filamentation. There is a tradeoff between gain balancing and thermal loading due to a reduction in the area of electrical pumping or due to additional photon absorption, i.e., photon heating, because of partial pumping comprising alternating pumped and unpumped stripe regions along the length of the stripe region. Thus, a balanced design takes into consideration both modal gain balance and thermal loading in the use a pumping pattern distribution that leads to a slight decrease in modal gain along the length of amplifier 340, which is indicated by the slightly diagonal line 314 compared to the idealized case of line 316 where no thermal or other effects are involved.

Monotonical patterning 342 provides for higher diffraction limited power through a spatial reduction of peak or maxima gain values throughout the spatial cavity region of gain medium 320 as represented by gain stripe 340. The monotonical increasing current density providing by pattern pumping reduce the peak modal gain observed within the medium spatial cavity so that the modal gain experienced in the spatial gain region of the cavity through which the light propagates is substantially reduced and balance throughout the cavity to be more uniform and constant. In other words, differential excitation employing a pumping pattern that increases current density in an exponential-like manner along its length provides a more flatten modal gain profile which is desirous toward achieving further enhancement of diffraction limited power and beam brightness and a reduction or elimination of optical filamentation.

While some prior known optical gain medium devices may show two electrically isolated pumping contacts for the purpose of altering the longitudinal gain profile, such as illustrated, for example, in FIGS. 6A and 6B of U.S. Pat. No. 4,751,719, through a modification of the current density, similar to that shown in FIG. 17c in this case, there is no recognition of the problems attenuate with the relationship of the modal gain profile and filamentation to tailor the longitudinal gain profile, let alone the lateral gain profile, toward flattening the gain profile to achieve the results obtain in this invention.

It should be recognized that the pattern distribution that provides for a monotonical increase in current density toward the output of a gain medium is also effective in the implementation of FIGS. 8–10, 12–14 with a major difference being the magnitude of the pattern proscribed. However, in any case, there are at least two congruent, electrically isolated contact regions capable of providing for monotonically increasing current density, via increased contact size or area, toward the output end of the device.

Figure 44:
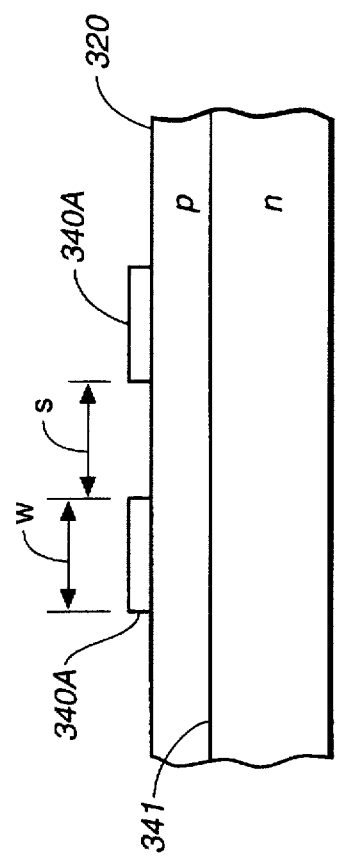
FIG. 44 is a partial side view illustrating the lateral side edge of dimensional aspects of pumping stripes utilized in the practice of this invention.

Reference is made to FIG. 44 which is utilized for the purpose of explaining the minuteness of the pumping pattern stripes 340A contemplated by the embodiment of the invention disclosed in FIG. 42a. In order to obtain monotonic control over the current density profile of the gain medium, the stripe elements 430A may be tenths of microns up to several microns in width. Stripe elements 340A are shown as metal surface contacts in FIG. 44 but it should be understood that these regions can be formed as a surface diffusion (contact region) or as a surface implant (resistive region) such as an H$^+$ implant, which, in either case, employing photolithographic techniques, can be patterned in a monotonic manner to provide for averaged current distribution along the length of gain medium stripe 342. Moreover, these contact patterns can be formed between active layer 341 and the medium substrate of the device along the length of medium 320. The longitudinal and/or lateral modal gain profiles along the length of such a gain medium, such as gain medium stripe 342, may be more precisely controlled and tailored with thin stripes regions having widths, W, or inter-stripe spacings, S, on the order of 1 μm or less, i.e., in the tenths of microns or combinations of both. The widths, W, of these pumping pattern lines 340A or the inter-stripe spacings, S, of lines 340A may be tailored to provide a substantially continuous variation in a fairly smooth monotonic manner to the current density with resulting modal gain profile that is more uniformly distributed along or across the length of gain medium 340. Gain medium 340 is shown in FIG. 44 to have an active region 341 that may comprise one or more semiconductor layers, as is well known in the art, including a single quantum well or multiple quantum wells separated by barriers (SQW). The thin stripe lines 340A can be of other geometric shapes with the point being that they are micro-contact stripe elements of monotonic variable size and/or spacing ranging from tenths of microns to several microns in width. Such small pumping elements permit the establishment of current density overlap in a monotonic degree as their linewidth, W, and/or their inter-stripe spacing, S, montonically changes. The degree of monotonic variation of the current density overlap in the medium is what provides a smooth monotonic increase in the current density as indicated from the fill factor distribution curve 343 in FIG. 42b.

The embodiment in FIG. 42a shows a pumping pattern distribution for principally effecting longitudinal pumping profiles. The pumping profiles shown in FIGS. 45 and 46, as well as in previously described in FIGS. 13 and 14 illustrate pumping pattern distributions principally effecting both longitudinal lateral modal gain profiles to achieve an monotonically altered modal gain profile in both the longitudinal and lateral directions, which may be particularly important in broad area gain media, such as broad area stripe lasers that have stripe widths, for example, of 200 μm or more.

Figure 45:
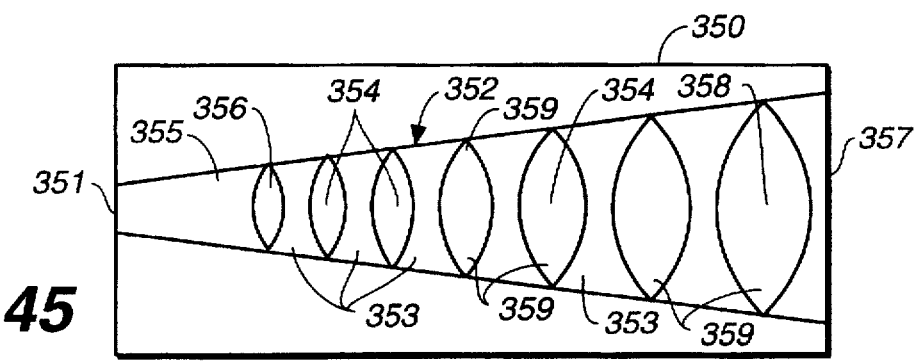
FIG. 45 is a plan view of a schematic illustration of another longitudinally, monotonically increasing pumping pattern distribution with laterally, monotonically increasing shapes illustrated in a diverging gain medium.
Figure 46:
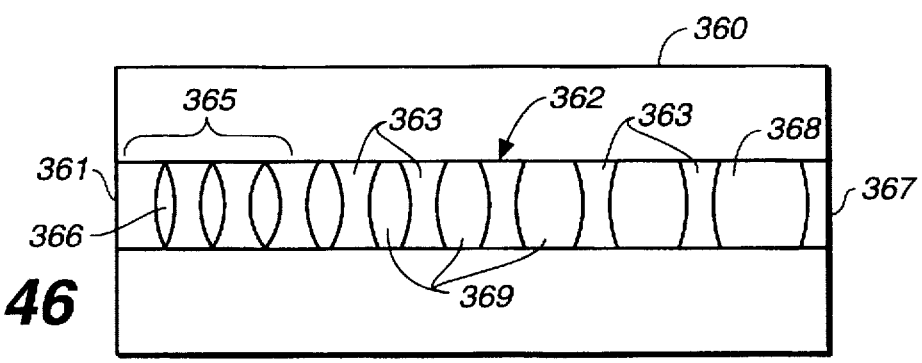
FIG. 46 is a plan view of a schematic illustration of another longitudinally, monotonically increasing pumping pattern distribution with laterally, monotonically decreasing shapes illustrated in a linear gain medium.

FIG. 45 shows a first of two embodiments of FIGS. 45 and 46 with pumping patterns that are designed for both longitudinal and lateral modal gain alterations toward achieving gain balancing, i.e., a more flattened modal gain profile longitudinally and laterally of the propagating light. The size of the patterns in FIGS. 45 and 46 are shown significantly enlarged in order to more fully disclose their geometrical nature. However, in reality, the pattern stripes 354 and 364 would be from a few microns, not exceeding a maximum width of 10 μm, and tapering in their lateral extent to one or more tenths of a micron. These patterns are formed by employing photolithography followed by the formation of the resistive regions upon exposure and development of a photoresist pattern.

In FIG. 45, gain medium 350 comprises a gain stripe 352 having diverging gain region with a pumping pattern of stripes 354 monotonically increasing from smallest pumping stripe 356 to largest pumping stripe 358, and is characterized by regions that are convex in shape. Stripes 354 may be formed by resistive regions 353, created, for example, by proton implant. Pumping stripes 354 are further characterized by being monotonically increasing in dimension laterally in their progression toward output end 357 with their tapered end portion 359 touching or otherwise in proximity to the edges of gain stripe 352 interacting with the higher modal gain at the lateral ends of the propagating mode toward effectively averaging out this higher gain. Pattern stripes 354 may extend to rearward extent 351 over region 355, or region 355 may include a uniform pumping pattern of the type shown at 326 in FIG. 42a for the purposes as previously indicated.

In FIG. 46, gain stripe 362 of gain medium 360 is linear in contour comprising a broad area, linear gain stripe rather than diverging, as in the case of gain stripe 352 in FIG. 45. Convex-shaped pumping stripes 364 monotonically increase in size from smallest pumping stripe 366 to largest pumping stripe 368. The stripe pattern configurations of either embodiment of FIGS. 45 and 46 is applicable to the other. Resistive regions 363 are formed by means, for example, of proton implant, creating a series of montonically increasing convex-shaped pumping stripes 364 that increase in size or area toward the output end 367 of the medium but montonically decreasing in size. Thus, pumping stripes 364 differ from pumping elements 354 in FIG. 45 principally by their lateral configuration where, in FIG. 45, the pumping stripes increase in lateral width and in FIG. 46, the pumping stripes 364 decrease in lateral width. Pumping stripes 364 have the particular advantage of providing less gain along the longitudinal edges of the waveguide of medium 360 where the propagating light interacts with the tapered end portions 369 in a manner causing higher modal gain at the lateral ends of the propagating mode. These gain peaks are sometimes referred to as "bat ears" or "top hat" since the near field of the mode resembles a bat or a top hat. By pumping these regions less compared to the interior regions of the gain stripe 362 as well as interacting with this higher region of modal gain, the bat ears present in the near field may be significantly attenuated. Pattern 364 may extend the entire stripe over region 362, or region 365 may include a uniform pumping pattern of the type shown at 326 in FIG. 42a for the purposes as previously indicated.

Figure 47:
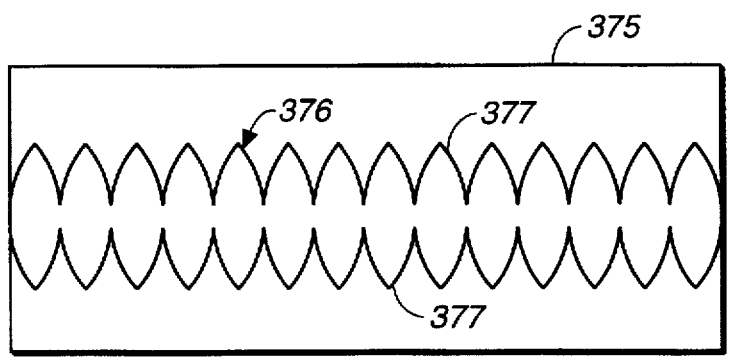
FIG. 47 is a plan view of a schematic illustration of a diverging gain medium with a first embodiment of a perturbation edge pattern for interacting with the propagating light to reduce edge peak gain toward establishing a more uniform gain profile.

One of the significant limitations on the Strehl ratio relative to the output of diverging gain medium, or a broad area, linear gain medium and unstable resonators is the presence of bat ears in the near field, referred to above. These bat ears are formed as the result of the interaction of the field edges of the propagating light with sharp changes in optical properties experienced at or near the edge of the gain stripe of these devices. By substantially eliminating these bat ears, the Strehl ratio can be significantly improved. The embodiments of FIGS. 47–51 relate to the elimination of bat ears through different geometrical approaches all comprising some type of built-in lateral current tailoring in the form of a laterally extended perturbation along the longitudinal edges of the gain stripe (FIGS. 47–50) or by means of changes in the longitudinal geometry of the gain stripe edges (FIG. 51). In FIG. 47, the convex-shaped pumping stripes of the type shown in FIG. 45, shown all of the same size are aligned along the longitudinal direction of light propagation of gain medium 375 in stripe region 376, and are in overlapping relation with one another forming a series of serrated edges 377, which we refer to in several embodiments as lateral perturbation edges. Edges 377 eliminate the formation of bat ears and scatter higher order modes preventing their oscillation. It should be importantly noted that the serrated edge pattern 377 in FIG. 47 may have a monotonically increasing periodicity, similar to the pattern ends 359 in FIG. 45 which will also contribute to the monotonical increase in current density of medium 375 to achieve also the benefits derived from a reduction in the effective linewidth enhancement factor, $\alpha_{lw}$, described in conjunction with FIG. 42.

Figure 48:
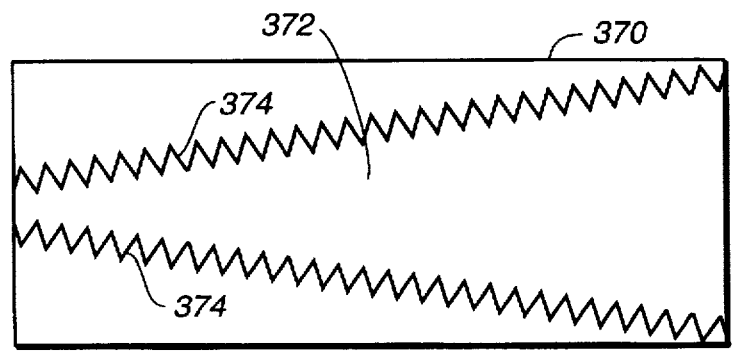
FIG. 48 is a plan view of a schematic illustration of a diverging gain medium with a second embodiment of a perturbation edge pattern for interacting with the propagating light to reduce edge peak gain toward establishing a more uniform gain profile.

In FIG. 48, diverging gain medium 370 comprises diverging gain stripe 372 that includes edges 374 with lateral perturbations comprising a serrated edge. Serrated edges 374 may be saw-toothed-shaped or any other lateral varying shape that will interact with the light. As indicated earlier, by "lateral" here, we mean that there are changes in longitudinal stripe edge geometry that extends in a direction transverse to the direction of light propagation.

Figure 49:
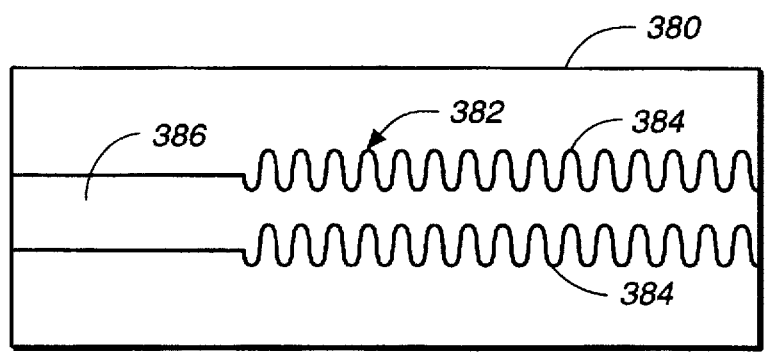
FIG. 49 is a plan view of a schematic illustration of a linear gain medium with a third embodiment of a perturbation edge pattern formed along at least a portion of the medium for interacting with the propagating light to reduce edge peak gain toward establishing a more uniform gain profile.
Figure 50:
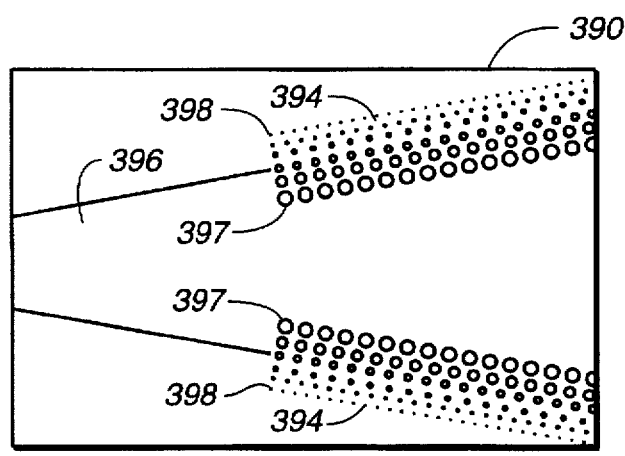
FIG. 50 is a plan view of a schematic illustration of a diverging gain medium with a fourth embodiment of a diverging perturbation edge pattern for interacting with the propagating light to reduce edge peak gain toward establishing a more uniform gain profile.
Figure 51:
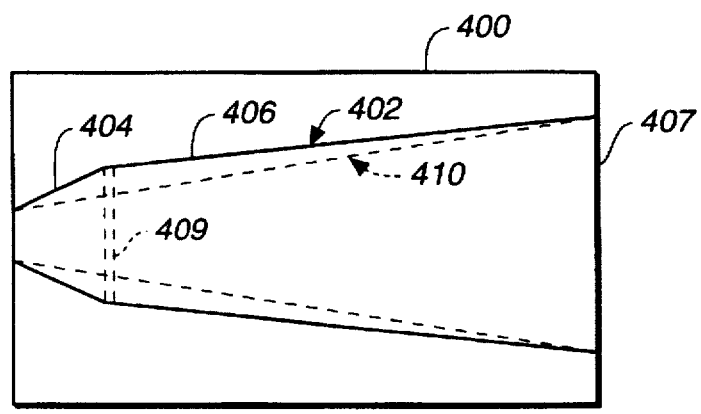
FIG. 51 is a plan view of a schematic illustration of a diverging gain medium with a fifth embodiment of a perturbation edge pattern for interacting with the propagating light to reduce edge peak gain toward establishing a more uniform gain profile.

The requirement of this embodiment as well as the following embodiments of FIGS. 49–51 is to provided a serration or feathering pattern or a geometric edge change along the gain stripe edge so that the field edge cannot establish a point of "recognition" of a firm gain stripe boundary along which the light can confidently propagate. It is the firm (straight-line) edge that permits the establishment of high peak gains that interact with the propagating light. By providing lateral perturbational edge changes over a lateral distance of about 10 µm to 50 µm transverse to the longitudinal direction of light propagation, or by providing geometrical changes along the gain stripe edge boundary in the longitudinal direction of light propagation, higher order modes are scattered along the edge regions of the gain stripe, the overall occurrence of optical filamentation is significantly reduced, lateral divergence of the beam is decreased which is particularly important in cases requiring high brightness, and provides a more Gaussian-like profile in the near field. Lateral perturbation edges of the several described embodiments of FIGS. 47–50 provide for a significant lower divergence in the far field because the edges prevent propagation of higher order modes, which modes have a higher divergence in the output compared to the fundamental modes more central of the waveguide which do not significantly interact with the perturbation edges. The higher order modes are prevented from propagating because they are deflected from the protruding perturbation edges and are scattered to a degree that prevents their possible oscillation or continuance. Therefore, greater enhancement of diffraction limited performance can be achieved with significant reduction in the far field divergence angle as much as 20% or more, increasing significantly the beam brightness, which has high applicability for applications requiring high brightness, such as laser print heads in thermal printers and other types of printers.

The laterally extended perturbational edges of these several embodiments of FIGS. 47–50 can be produced by forming them along the edges of a metal contact formed on the surface of the gain medium employing photolithographic techniques or formed by a patterned proton implant, such as an H+ implant, in regions outside of and adjacent to the gain stripe region.

The embodiment shown in FIG. 49 contains the same type of laterally extended perturbations as in the case of FIG. 48 except that gain stripe 382 of gain medium 380 is a linear gain region rather than a diverging gain region and is of a sinusoidal-shaped or any other lateral varying shape, extending laterally tens of microns, to interact with the propagating light along edges 384. The perturbational edges 384 extend only over a portion of the opposite edges of the gain stripe, i.e., they do not extend into the rearward region 386 of gain stripe 382. While the laterally extended perturbational edges of this embodiment and the previous and next embodiment may extend the full course of the gain stripe, it may not be a requirement to do so since the high gain peaks forming the bat ears are more likely to be generated in the forward regions of the gain stripe regions than in their rearward extent.

It should be noted that the effect of the tapered end portions 359 and 369 of the embodiments in FIGS. 45 and 46 have the same effect as the laterally extended perturbational edges 374, 384 and 394 of FIGS. 48, 49 and 50, respectively, i.e., tapered end portions 359 and 369 effectively interact with the propagating light to attenuate the higher modal gain present along the gain stripe edges.

The embodiment of FIG. 50 illustrates another geometric type of laterally extended perturbational edge comprising a plurality of spots, such as dots, triangles, squares or other minute polygonal shapes (referred to collectively as a dithered toning pattern), which are formed laterally in a region along the gain stripe 392 of gain medium 390. The dithered toning pattern 394 of perturbational spots may be aligned or randomly placed along the edges and may be montonically decreasing in size from inner edge 397 to outer edge 398 or visa versa. Alternatively, different sizes of these pattern spots may intermingled among themselves. The point is that this laterally extended dithered toning pattern 394 of resistive regions force the propagating light to take meandering paths along the edge so that there is no firm or defined edge along which the optical field edge can propagate, as previous discussed. As mentioned in connection with the previous embodiment, dithered toning pattern 394 may extend over a portion of the opposite edges of gain stripe 392, i.e., they do not need to extend its full length, such as into the rearward region 396 of gain stripe 392.

The embodiment shown in FIG. 51 comprises a geometric change along the gain stripe edges in the longitudinal direction of light propagation to eliminate the formation of bat ears in the far field by changing the contact geometry. Gain medium 400 includes diverging gain stripe 402 that does not follow the continuous straight-line pattern 410 of the basic diverging gain medium design, but rather comprises an initial wider diverging section 404 formed for a short distance at the rearward extent of gain stripe 402 and then tapers more narrowly in diverging section 406 toward the termination point of the generic diverging gain pattern at output end 407 of gain medium 400. Enlargement of the beam propagation in wider diverging section, such as to about 100 µm, for example, has the effect of trimming the bat ears in the optical near field.

The single contact approach exhibited in FIG. 51 does moderately increase the threshold current of the device since portions of the pumped amplifier gain stripe may experience no propagating light, particularly at corners 408. This problem can be efficiently solved by eliminating these corners by adopting electrically separate pumped contacts for gain sections 404 and 406, as indicated by dotted lines 409 to form double-tapered amplifiers or, more importantly, by employing a pumping pattern of the type illustrated in FIGS. 42, 45 or 46 at least over significant portions of the diverging gain stripe 402, if not over its full extent. In this connection, anyone of foregoing embodiments of FIGS. 47–51 may be incorporated with longitudinal and/or lateral current density tailoring as explained in connection with FIGS. 42–46.

The forgoing differential excitation patterning embodiments disclosed in the original applications as well as in the additions disclosed relative to added embodiments herein are applicable to all classes of pumping gain stripe configurations, beside diverging gain stripe, tapered or flared optical semiconductor devices. The major of such configurations are disclosed in FIGS. 52a–52e. The embodiments of FIGS. 47–50 can be applied to any of these different configurations. The patterning concepts are applicable to the broad spectrum of both diverging and linear gain stripe media including all wavelengths from visible to the far infrared, to different geometries, such as unstable resonators, amplifiers discrete and monolithic MOPA's, and to device configurations, such as single device, linear laser diode arrays or bars or array or bar stacks.

Figure 52A:
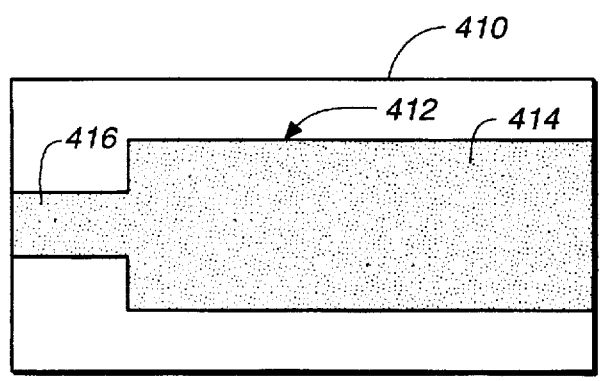
FIGS. 52a–52e is a series of gain stripe patterns and Bragg feedback mechanisms for laser and optical semiconductor amplifiers with which any of one the pumping pattern distribution patterns of this invention may be utilized.

In FIG. 52a, gain medium 410 has a gain stripe 412 comprising a broad area pumped region 414 and a narrow single mode filter region 416. The embodiments of this invention have particular advantages, as previously discussed, for broad area pumped region 414 in the substantial reduction, if not elimination, of filamentation while improving the output brightness and optical power level achievable from such a device.

Figure 52B:
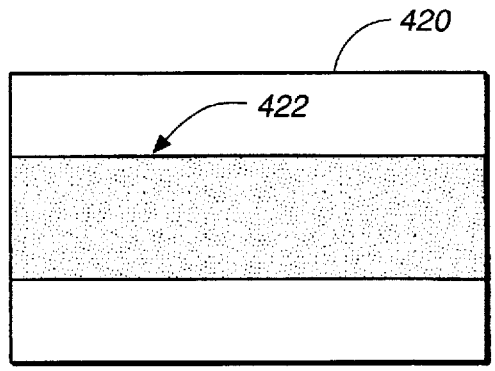
Figure 52C:
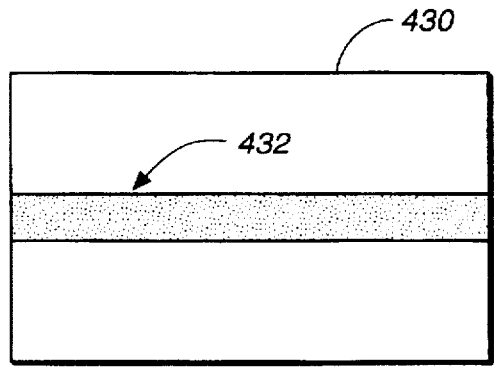

FIG. 52b is a broad area stripe gain medium 420 having a single broad area stripe 422 while FIG. 52c is a narrow, single mode gain medium 430 having a single mode stripe 432. The broad area stripe regions 414 and 422 of FIGS. 52a and 52b provide amplifying regions having a width of at least ten times the optical wavelength. The application of this invention, particularly the monotonic pumping pattern 342 of FIGS. 42a and 42c as applied to single mode laser diode devices is useful in increasing the levels at which kinks can occur, which increases the diffraction limited performance and lowers the linewidth of the device. It also eliminates in the devices of FIG. 52b and 52c spatial hole burning which increases single spectral line power.

Figure 52D:
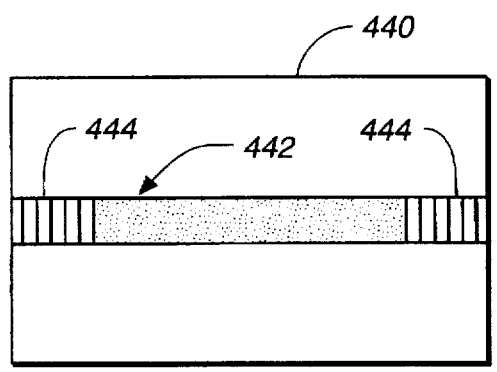
Figure 52E:
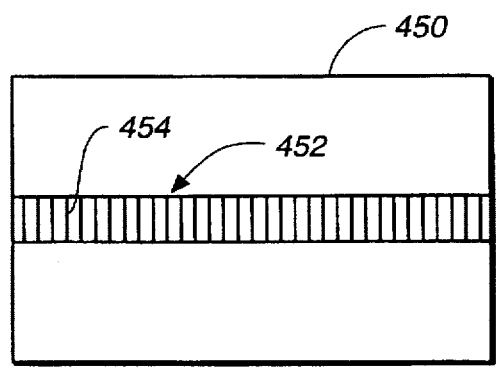

FIGS. 52d and 52e depict gain media in the form of Bragg feedback laser diodes. In FIG. 52d, DBR laser diode 440 has a gain stripe 442 and buried end Bragg gratings 444 formed in the device for light feedback to form a resonant cavity between gratings 444. In FIG. 52e, DFB laser diode 450 has a gain stripe 452 with a buried Bragg grating extending the full extent of its resonant cavity which is the length of stripe 452. A characteristic in the operation of these DBR/DFB laser diode devices is the development of spatial hole burning along the pumped active region which is a form of filamentation having catastrophic effect with increasing power output. The employment of the pattern pumping, such as discussed in connection with FIGS. 42 and 44, significantly reduces, if not entirely eliminates, the formation of spatial hole burning in these devices.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications as that are within the spirit and scope of the following claims.

What is claimed is:

1. An optical semiconductor device comprising:
   an active gain region, including a region allowing divergence of light propagating along its length; and
   patterned means for differentially exciting at least a portion of said light diverging region.

2. The optical semiconductor device of claim 1 wherein said patterned differential excitation means reduces the rate of filamentation within said diverging region.

3. The optical semiconductor device of claim 1 wherein said patterned differential excitation means reduces the maximum gain within said diverging region.

4. The optical semiconductor device of claim 3 wherein said patterned differential excitation means reduces the rate of filamentation within said diverging region.

5. The optical semiconductor device of claim 1 wherein said patterned differential excitation means provides for at least approximately uniform modal gain along a length of at least a portion of said active gain region.

6. The optical semiconductor device of claim 1 wherein said patterned differential excitation means provides for at least approximately uniform modal gain along a length of at least said diverging region.

7. The optical semiconductor device of any one of claims 1 through 6 wherein the patterning of said patterned differential excitation means provides monotonically increasing pumping density along said exciting at least a portion of said light diverging region.

8. The optical semiconductor device of claim 1 wherein said light diverging region has a width of at least ten times the optical wavelength.

9. An optical semiconductor device comprising an active region including an amplifying region having a width of at least ten times the optical wavelength; and patterned means for differentially exciting said light amplifying region.

10. The optical semiconductor device of claim 9 wherein said differential excitation means reduces the rate of filamentation within said amplifying region.

11. The optical semiconductor device of claim 9 wherein said differential excitation means reduces the maximum gain within said amplifying region.

12. The optical multilayer semiconductor device of claim 11 wherein said differential excitation means reduces the rate of filamentation within said amplifying region.

13. The optical amplifier semiconductor device of claim 9 wherein said differential excitation means provides for at least approximately uniform modal gain along a length of at least a portion of said active gain region.

14. The optical amplifier semiconductor device of claim 9 wherein said differential excitation means provides for at least approximately uniform modal gain along its length.

15. The optical semiconductor device of any one of claims 9 through 14 wherein said light amplifying region includes at least a portion thereof having patterned differential excitation means.

16. The optical semiconductor device of claim 15 wherein said optical amplifier semiconductor device includes a single mode region.

17. The optical semiconductor device of claim 16 wherein said single mode region is a single mode filter.

18. The optical semiconductor device of claim 16 wherein said single mode region is a single mode oscillator.

19. The optical semiconductor device of claim 15 wherein the patterning of said patterned differential excitation means provides monotonically increasing pumping density along at least a portion of said amplifying region.

20. A optical semiconductor device comprising:
   an active region, including a light gain region; and
   patterned pumping means for differentially exciting at least a portion of said gain region.

21. The optical semiconductor device of claim 20 wherein said differential excitation means reduces filamentation within said gain region.

22. The optical amplifier semiconductor device of claim 20 wherein said differential excitation means reduces peak gain across its modal gain profile within said gain region.

23. The optical amplifier multilayer semiconductor device of claim 22 wherein said optical amplifier semiconductor device comprises single mode, linear stripe device, a multimode, linear stripe device, a diverging stripe device, a DFB device, or a DBR device.

24. The optical semiconductor device of claim 20 wherein said differential excitation means approximates uniform modal gain along a length of at least a portion of said gain region.

25. The optical semiconductor device of claim 20 wherein said differential excitation means approximates uniform modal gain along its length.

26. The optical semiconductor device of claim 20 wherein said optical amplifier semiconductor device comprises a single mode region.

27. The optical semiconductor device of claim 26 wherein said single mode region is a single mode filter.

28. The optical semiconductor device of claim 26 wherein said single mode region is a single mode oscillator.

29. The optical semiconductor device of claim 20 wherein said optical amplifier semiconductor device comprises a multimode region.

30. The optical semiconductor device of any one of claims 20 through 29 wherein the patterning of said patterned differential excitation means provides monotonically increasing pumping density along at least a portion of said gain region.

31. The optical semiconductor device of claim 30 further comprising lateral extending perturbation edges along at least a portion of boundaries of said light gain region to interact with light propagation therealong.

32. The optical semiconductor device of claim 31 wherein said lateral extending perturbation edges comprise a serrated-like geometry.

33. The optical semiconductor device of claim 20 further comprising lateral extending perturbation edges along at least a portion of boundaries of said light gain region to interact with light propagation therealong.

34. The optical semiconductor device of claim 20 wherein said light gain region comprises a linear contact stripe region or a diverging contact stripe region along at least a portion of said light gain region, the patterning of said patterned differential excitation means providing monotonically increasing pumping density along said light gain region portion.

35. In an optical semiconductor gain medium, a pumping pattern incorporated along at least a portion of a pumping stripe for the gain medium for creating a differential current density profile along medium pumping stripe portion in a direction of light propagation providing for a modal gain flattening of a modal gain profile of the medium spatially along of said medium pumping stripe portion.

36. In the optical semiconductor gain medium of claim 35 wherein the medium comprises a single mode, stripe laser, a broad area stripe laser, a DFB laser, a DBR laser or an unstable resonator.

37. In the optical semiconductor gain medium of claim 35 wherein said pumping pattern is a plurality of contract stripes with increasing applied current density in the direction of light propagation.

38. In the optical semiconductor gain medium of claim 35 wherein said pumping pattern is a plurality of contract stripes that monotonically increase in width or in inter-stripe spacing along at least a portion of the pumping stripe in the direction of light propagation.

39. In the optical semiconductor gain medium of claim 38 wherein said contract stripes also monotonically decrease in width or in inter-stripe spacing in a direction along their lateral length which is transverse to the direction of light propagation.

40. In the optical semiconductor gain medium of claim 38 wherein said contract stripes are wider at their central portion compared to their end portions.

41. In the optical semiconductor gain medium of claim 40 further comprising lateral extending perturbation edges along at least a portion of edges of said pumping stripe to interact with light propagation therealong.

42. In the optical semiconductor gain medium of claim 41 wherein said lateral extending perturbation edges comprise a serrated-like geometry.

43. In the optical semiconductor gain medium of claim 42 wherein said serrated-like geometry comprises a saw-tooth, sinusoidal or peak-to-peak pattern.

44. In the optical semiconductor gain medium of claim 35 further comprising lateral extending perturbation edges along at least a portion of edges of said pumping stripe to interact with light propagation therealong.

45. In the optical semiconductor gain medium of claim 44 wherein said lateral extending perturbation edges comprise a serrated-like geometry.

46. In the optical semiconductor gain medium of claim 45 wherein said serrated-like geometry comprises a saw-tooth, sinusoidal or peak-to-peak pattern.

47. In the optical semiconductor gain medium of claim 35 wherein said pumping stripe is a wide area linear stripe or a diverging stripe.

48. In the optical semiconductor gain medium of claim 35 wherein said gain medium is optically coupled to a single mode filter.

49. In the optical semiconductor gain medium of claim 48 further comprising lateral extending perturbation edges along at least a portion of edges of said single mode filter to interact with light propagation therealong.

50. In the optical semiconductor gain medium of claim 48 wherein said single mode filter is integral with said gain medium or is optically coupled to said gain medium externally thereof.

51. In the optical semiconductor gain medium of claim 50 wherein said single mode filter is a laser oscillator forming a MOPA with said gain medium.

52. In the optical semiconductor gain medium of claim 35 wherein the modal gain profile montonically decreases toward edges of said medium pumping stripe portion.

53. In the optical semiconductor gain medium of claim 35 wherein said pumping pattern comprises a plurality of adjacently disposed stripes of varying width or inter-stripe spacing along said gain medium pumping stripe portion.

54. In the optical semiconductor gain medium of claim 35 wherein said pumping pattern comprises a plurality of adjacently disposed stripes of varying width or inter-stripe spacing wherein the inter-stripe spacing comprises resistive regions formed along said gain medium pumping stripe portion.

55. In the optical semiconductor gain medium of claim 35 wherein longitudinal boundaries of said pumping pattern are oriented predominately transversely to the direction of light propagation.

\* \* \* \* \*